United States Patent
Kim et al.

(10) Patent No.: US 9,496,440 B2
(45) Date of Patent: Nov. 15, 2016

(54) SOLAR CELL MODULE

(71) Applicant: LG ELECTRONICS INC., Seoul (KR)

(72) Inventors: Jongdae Kim, Seoul (KR); Kisu Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 14/701,197

(22) Filed: Apr. 30, 2015

(65) Prior Publication Data

US 2015/0249176 A1 Sep. 3, 2015

Related U.S. Application Data

(63) Continuation of application No. 13/472,038, filed on May 15, 2012, now Pat. No. 9,040,813.

(30) Foreign Application Priority Data

Feb. 23, 2012 (KR) .................. 10-2012-0018330

(51) Int. Cl.
*H01L 31/05* (2014.01)
*H01L 31/0224* (2006.01)
(Continued)

(52) U.S. Cl.
CPC ... *H01L 31/0504* (2013.01); *H01L 31/022425* (2013.01); *H01L 31/0512* (2013.01); *H01L 31/068* (2013.01); *H01L 31/1804* (2013.01); *Y02E 10/547* (2013.01); *Y02P 70/521* (2015.11)

(58) Field of Classification Search
USPC ................. 136/252, 255, 256, 251
See application file for complete search history.

(56) References Cited

U.S. PATENT DOCUMENTS 7,638,708 B2* 12/2009 Fork et al. ............ 136/246
2005/0221613 A1 10/2005 Ozaki et al.
(Continued)

FOREIGN PATENT DOCUMENTS

| EP | 2020688 | 2/2009 |
|---|---|---|
| EP | 2058868 | 5/2009 |

(Continued)

OTHER PUBLICATIONS

Hayashi et al. WO 2011046176A1, English Translation of the specification.
(Continued)

*Primary Examiner* — Susan D Leong
(74) *Attorney, Agent, or Firm* — Dentons US LLP

(57) ABSTRACT

A solar cell module includes a plurality of solar cells each comprising a substrate, an emitter region placed at the substrate, an anti-reflection region placed on the emitter region, first electrodes placed on the substrate, first bus bars placed on the substrate and connected to the first electrodes, second electrodes placed on the substrate, and second bus bars placed on the substrate and connected to the second electrodes. The anti-reflection region includes a first opening region through which part of the emitter region is exposed and one or more second opening regions through which part of the emitter region is exposed. The first electrode is connected to the exposed emitter region of the first opening region through the anti-reflection region by metal plating and the first bus bar is connected to the exposed emitter region of one or more second opening regions through the anti-reflection region by metal plating. An interconnector electrically connects the first bus bar and the first bus bar or the second bus bar of an adjacent solar cell of the plurality of solar cells.

23 Claims, 22 Drawing Sheets

(51) Int. Cl.
  *H01L 31/068*     (2012.01)
  *H01L 31/18*      (2006.01)

(56) References Cited

U.S. PATENT DOCUMENTS

| | | |
|---|---|---|
| 2007/0095387 A1* | 5/2007 | Fujii ................ H01L 31/0512 |
| | | 136/251 |
| 2007/0144578 A1 | 6/2007 | Cunningham et al. |
| 2009/0032081 A1 | 2/2009 | Saita et al. |
| 2009/0194151 A1 | 8/2009 | Ishikawa et al. |
| 2009/0223549 A1 | 9/2009 | Ounadjela et al. |
| 2009/0260684 A1 | 10/2009 | You |
| 2010/0015750 A1 | 1/2010 | Shen et al. |
| 2010/0154873 A1 | 6/2010 | Hilali et al. |
| 2010/0218821 A1 | 9/2010 | Kim et al. |
| 2010/0224228 A1 | 9/2010 | Kim et al. |
| 2010/0319766 A1 | 12/2010 | Suh |
| 2010/0319770 A1 | 12/2010 | Lee et al. |
| 2011/0088746 A1 | 4/2011 | Hong et al. |
| 2011/0308608 A1* | 12/2011 | Shim ................ H01L 31/02168 |
| | | 136/258 |
| 2011/0315188 A1 | 12/2011 | Hong et al. |
| 2012/0298171 A1 | 11/2012 | Huang et al. |

FOREIGN PATENT DOCUMENTS

| | | |
|---|---|---|
| EP | 2337081 A2 | 6/2011 |
| EP | 2421055 A2 | 2/2012 |
| EP | 2490265 | 8/2012 |
| JP | 2002373996 | 12/2002 |
| JP | 2004266023 | 9/2004 |
| JP | 2008153670 A | 7/2008 |
| JP | 2009509353 A | 3/2009 |
| JP | 2013175703 A | 9/2013 |
| WO | 2006005116 | 1/2006 |
| WO | 2010/126038 A1 | 11/2010 |
| WO | 2011046176 | 4/2011 |
| WO | 2011152319 A1 | 12/2011 |
| WO | 2011162406 A1 | 12/2011 |
| WO | 2013090570 A1 | 6/2013 |

OTHER PUBLICATIONS

Kobamoto WO 2010126038A1, English Translation of the specification.

* cited by examiner

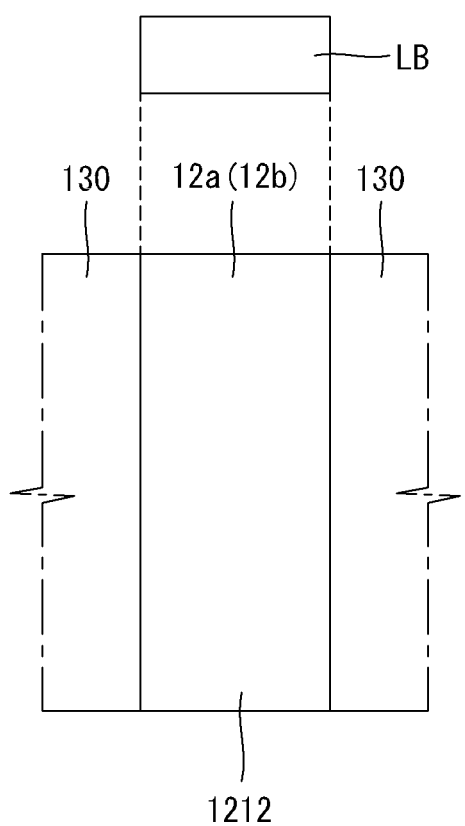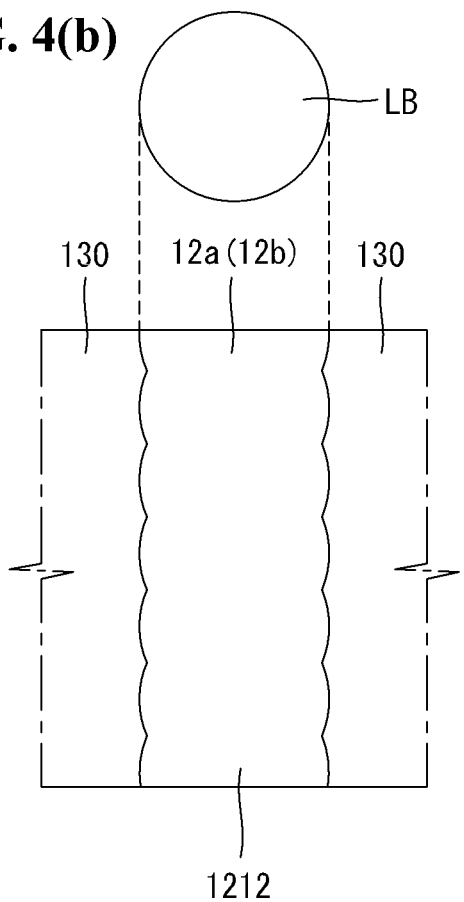

SOLAR CELL MODULE

This application is a continuation of U.S. application Ser. No. 13/472,038 filed May 15, 2012, which claims priority to and benefit of Korean Patent Application No. 10-2012-0018330, filed in the Korean Intellectual Property Office on Feb. 23, 2012, the entire contents of which are incorporated herein by reference.

BACKGROUND (a) Field of Disclosure

The present disclosure relates to a solar cell module.

(b) Description of the Related Art

As the existing energy resources, such as oil or coal, are expected to be exhausted, there is recently an increasing interest in alternative energy sources that will replace the existing energy resources, and thus a solar cell that generates electrical energy using solar power has been in the spotlight.

A common solar cell includes semiconductor regions, forming a p-n junction by different conductive types like a p type and an n type, and electrodes connected to the respective semiconductor regions having different conductive types.

When sunlight is incident on the solar cell, electrons and holes are generated from the semiconductor. Electrons generated from the p-n junction move toward the n type semiconductor region, and holes generated from the p-n junction move toward the p type semiconductor region. The moved electrons and holes are collected by the different electrodes connected to the p type semiconductor region and the n type semiconductor region, and electric power is obtained by connecting the electrodes using electric wires.

SUMMARY

A solar cell module according an aspect of present invention comprises a plurality of solar cells each comprising a substrate, an emitter region placed at the substrate, an anti-reflection region placed on the emitter region, first electrodes placed on the substrate, first bus bars placed on the substrate and connected to the first electrodes, second electrodes placed on the substrate, and second bus bars placed on the substrate and connected to the second electrodes; the anti-reflection region comprising a first opening region through which part of the emitter region is exposed and one or more second opening regions through which part of the emitter region is exposed, wherein the first electrode is connected to the exposed emitter region of the first opening region through the anti-reflection region by metal plating and the first bus bar is connected to the exposed emitter region of one or more second opening regions through the anti-reflection region by metal plating; and an interconnector to electrically connect the first bus bar and the first bus bar or the second bus bar of an adjacent solar cell of the plurality of solar cells.

A resistance value of the exposed emitter region of the first opening region may be greater than a resistance value of the exposed emitter region of the one or more second opening regions.

A conductive adhesion film may be placed between at least one of the first bus bar and the second bus bar and the interconnector, and may contain a plurality of conductive particles dispersed in resin to electrically connect at least one of the first bus bar and the second bus bar and the interconnector.

At least one of the plurality of conductive particles may have a thickness greater than or equal to a thickness of the conductive adhesion film. In another aspect, at least one of the plurality of conductive particles has a thickness smaller than a thickness of the conductive adhesion film.

At least one of the plurality of conductive particles may be embedded in at least one of the interconnector and the first bus bar or the second bus bar.

The conductive particle may be formed of a metal-coated resin particle comprising one or more kinds, selected from copper (Cu), silver (Ag), gold (Au), iron (Fe), nickel (Ni), lead (Pb), zinc (Zn), cobalt (Co), titanium (Ti), and magnesium (Mg), as ingredients.

The conductive particle may be formed of a metal particle made of one or more kinds, selected from copper (Cu), silver (Ag), gold (Au), iron (Fe), nickel (Ni), lead (Pb), zinc (Zn), cobalt (Co), titanium (Ti), and magnesium (Mg).

The metal particle may have a circle, an oval, or a radial shape. In another aspect, at least one of the conductive particles may have irregular or protruded portions.

The interconnector may be made of conductive metal.

The conductive metal may comprises a lead component of 1,000 ppm or less.

The interconnector may further comprise solder coated on a surface of the conductive metal.

At least one of the first bus bar and the second bus bar may have an uneven surface.

The conductive adhesion film may have the same width as at least one of the first bus bar and the second bus bar.

The conductive adhesion film may have a greater width than at least one of the first bus bar and the second bus bar.

The anti-reflection region may further comprise a plurality of grooves spaced apart from the plurality of second opening regions and have the anti-reflection region or the emitter region exposed therethrough.

Nickel silicide may be included in between the substrate and at least one of the first electrode and the first bus bar.

At least one of the first electrode and the first bus bar may be formed by the metal plating such that at least one curved surface shape is formed.

At least one of the first electrode and the first bus bar may comprise a first film placed on the substrate and made of nickel (Ni) and a second film placed on the first film and made of silver (Ag) or copper (Cu).

At least one of the first electrode and the first bus bar may further comprise a third film placed on the second film and made of silver (Ag) or tin (Sn) when the second film may be made of copper (Cu).

A first surface of at least one of the first bus bar and the second bus bar coming in contact with the conductive adhesion film may have a convex curved surface.

A height at a center of the conductive adhesion film may be smaller than a height at an edge of the conductive adhesion film.

BRIEF DESCRIPTION OF THE DRAWINGS

FIGS. 4(a) and 4(b) are respective plan views of a first opening region or a second opening region;

DETAILED DESCRIPTION OF THE EMBODIMENTS

Figure 1:
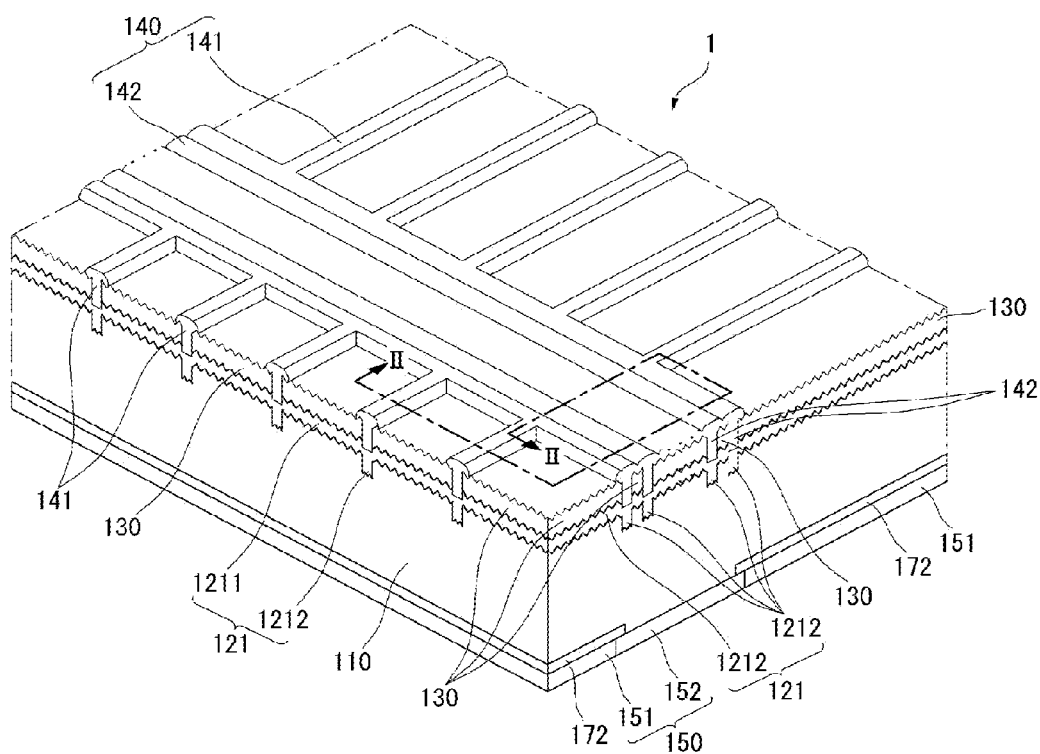
FIG. 1 is a partial perspective view of an example of a solar cell according to an embodiment of the present invention.

Hereinafter, some exemplary embodiments of the present invention are described in detail with reference to the accompanying drawings in order for those skilled in the art to be able to readily implement the invention. However, the present invention may be modified in various forms and are not limited to the following embodiments. In order to clarify a description of the embodiments of the present invention, parts not related to the description may be omitted, and the same reference numbers are used throughout the drawings to refer to the same or like part.

In the drawings, the thickness of each of layers and regions may be enlarged for better understanding and ease of description. When it is described that one part, such as a layer, a region, or a plate, is "over" the other part, it means not only that one part is placed "right on" the other part, but also that a third part is placed between one part and the other part. Meanwhile, when it is described that one part, such as a layer, region, or plate, is "right on" the other part, it means that a third part does not exist between one part and the other part.

A solar cell and a solar cell module according to an embodiment of the present invention are described below with reference to the accompany drawings.

An example of a solar cell 1 according to an embodiment of the present invention is described in detail with reference to FIGS. 1 to 8.

Figure 2:
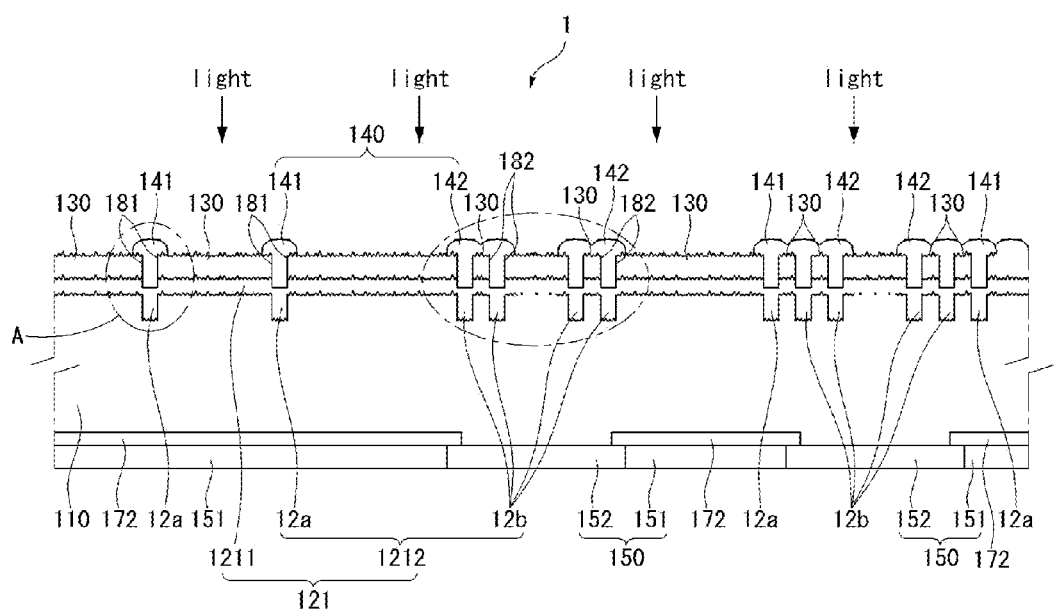
FIG. 2 is a cross-sectional view of the solar cell of FIG. 1 taken along line II-II.

Referring to FIGS. 1 and 2, the solar cell 1 according to the embodiment of the present invention includes a substrate 110, an emitter region 121 placed on the front surface (i.e., a first surface) side of the substrate 110 on which light is incident, an anti-reflection region 130 placed over the emitter region 121, a front electrode region 140 placed over the front surface of the substrate 110 and configured to include a plurality of front electrodes 141 (i.e., a plurality of first electrodes) and a plurality of front bus bars 142 (i.e., a plurality of first bus bars) connected to the plurality of front electrodes 141, back surface field regions 172 placed on the back surface (i.e., a second surface) side of the substrate 110 (i.e., an opposite surface to the front surface of the substrate 110), and back electrode regions 150 placed on the back surface field regions 172 and the back surface of the substrate 110 and configured to include a plurality of back electrodes 151 (i.e., second electrodes) and a plurality of back bus bars 152 (i.e., a plurality of second bus bars) connected to the back electrodes 151.

The substrate 110 is a semiconductor substrate formed to have a first conductive type (e.g., a p type conductive type) and made of semiconductor, such as silicon. The semiconductor is a crystalline semiconductor, such as polycrystalline silicon or single crystalline silicon.

When the substrate 110 is a p type conductive type, impurities of a group III element, such as boron (B), gallium (Ga), or indium (In), are doped into the substrate 110. However, the substrate 110 may be an n type conductive type and may be made of semiconductor materials other than silicon. When the substrate 110 has an n type conductive type, impurities of a group V element, such as phosphorus (P), arsenic (As), or antimony (Sb), are doped into the substrate 110.

As shown in FIGS. 1 to 3, the front surface of the substrate 110 is textured, thus having a textured surface (i.e., a concave-convex surface) having a plurality of convex parts 11 and a plurality of concave parts 12. Since the surface area of the substrate 110 is increased by the textured surface, an area on which light is incident is increased, but the amount of light reflected from the substrate 110 is reduced. Accordingly, the amount of light incident on the substrate 110 is increased.

As described above, the front surface of the substrate 110 is the concave-convex surface having the plurality of convex parts 11 and the plurality of concave parts 12. As shown in FIGS. 1 to 3, each of the emitter region 121 placed over the front surface of the substrate 110 and a surface of the anti-reflection region 130 placed over the emitter region 121 also have a concave-convex surface including a plurality of convex parts 21 and a plurality of concave parts 22.

The emitter region 121 is an impurity doping region into which impurities having a second conductive type (e.g., an n type conductive type) opposite to the conductive type of the substrate 110 have been doped and is placed on the front surface side of the substrate 110. Thus, the emitter region 121 and the first conductive type region of the substrate 110 form a p-n junction.

The emitter region 121 includes a first emitter part 1211 (i.e., a first impurity doping part) and a second emitter part 1212 (i.e., a second impurity doping part) having different impurity doping thicknesses and different surface resistance values.

In the present embodiment, an impurity doping thickness of the first emitter part 1211 is smaller than an impurity doping thickness (i.e., depth) of the second emitter part 1212, and thus an impurity doping concentration of the first emitter part 1211 is also smaller than an impurity doping concentration of the second emitter part 1212. Thus, a surface resistance value of the first emitter part 1211 is greater than a surface resistance value of the second emitter part 1212. For example, the surface resistance value of the first emitter part 1211 may be about 80 Ω/sq. to 120 Ω/sq., and the surface resistance value of the second emitter part 1212 may be about 10 Ω/sq. to 50 Ω/sq.

Accordingly, the emitter region 121 of the present embodiment has a selective emitter structure including the first and the second emitter parts 1211 and 1212 having different surface resistance values and different impurity doping concentrations.

The p-n junction (i.e., the first junction) of the first emitter part 1211 and the substrate 110 [i.e., the first conductive type region of the substrate 110] and the p-n junction (i.e., the second junction) of the second emitter part 1212 and the substrate 110 are placed at different heights. Accordingly, a thickness from the back surface of the substrate 110 to the first junction is greater than a thickness from the back surface of the substrate 110 to the second junction.

As shown in FIGS. 1 and 2, the first emitter part 1211 of the emitter region 121 is placed under the anti-reflection region 130. The second emitter part 1212 is placed under the plurality of front electrodes 141 and the plurality of front bus bars 142. The second emitter part 1212 includes a second emitter part 12a (i.e., the first part of the emitter region) for a plurality of electrodes which is the second emitter part 1212 placed under the plurality of front electrodes 141 and a plurality of second emitter parts 12b (i.e., the second parts of the emitter region) for a plurality of bus bars which is the second emitter parts 1212 placed under the plurality of front bus bars 142.

The width W11 of the second emitter part 12a for each electrode is identical with the width W12 of the second emitter part 12b for each bus bar. For example, each of the width W11 of the second emitter part 12a for each electrode and the width W12 of the second emitter part 12b for each bus bar may be about 5 μm to 15 μm.

Figure 5:
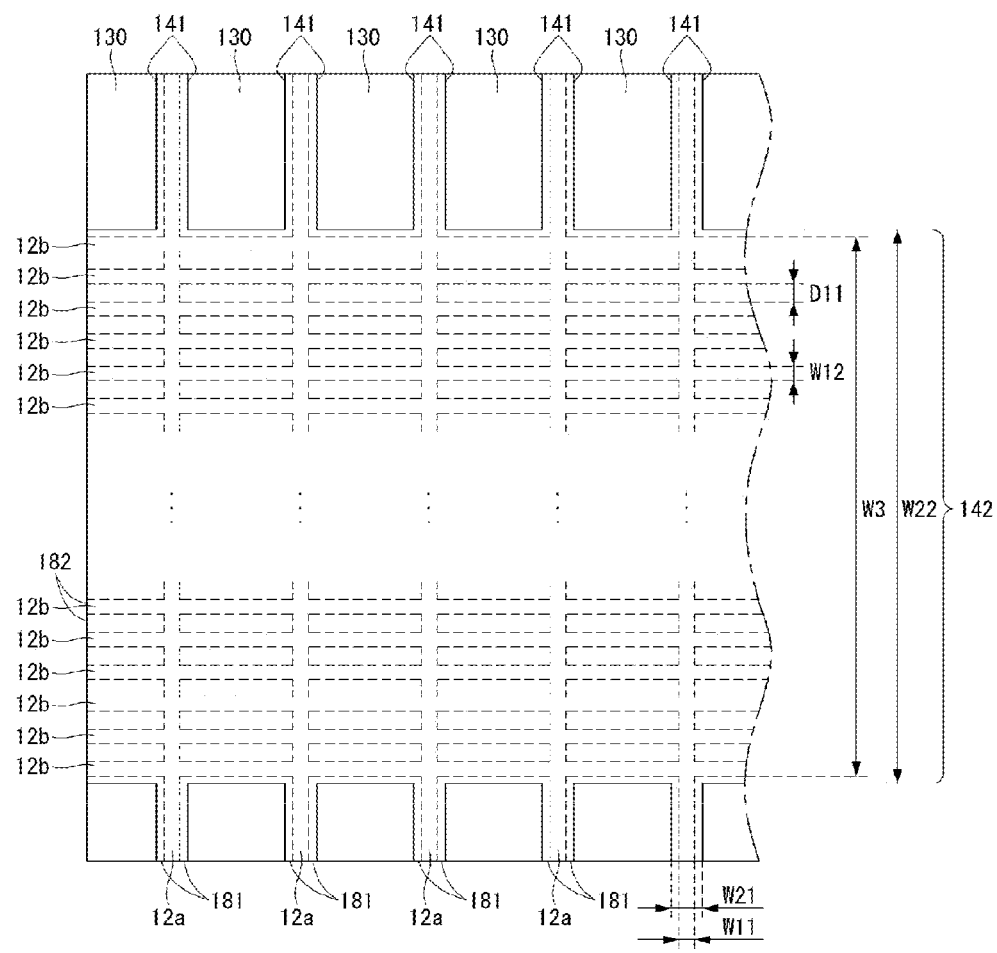
FIGS. 5 and 6 are schematic plan views each showing part of the front electrode region of the solar cell and part of an emitter region placed under the front electrode region thereof according to the present embodiment.
Figure 6:
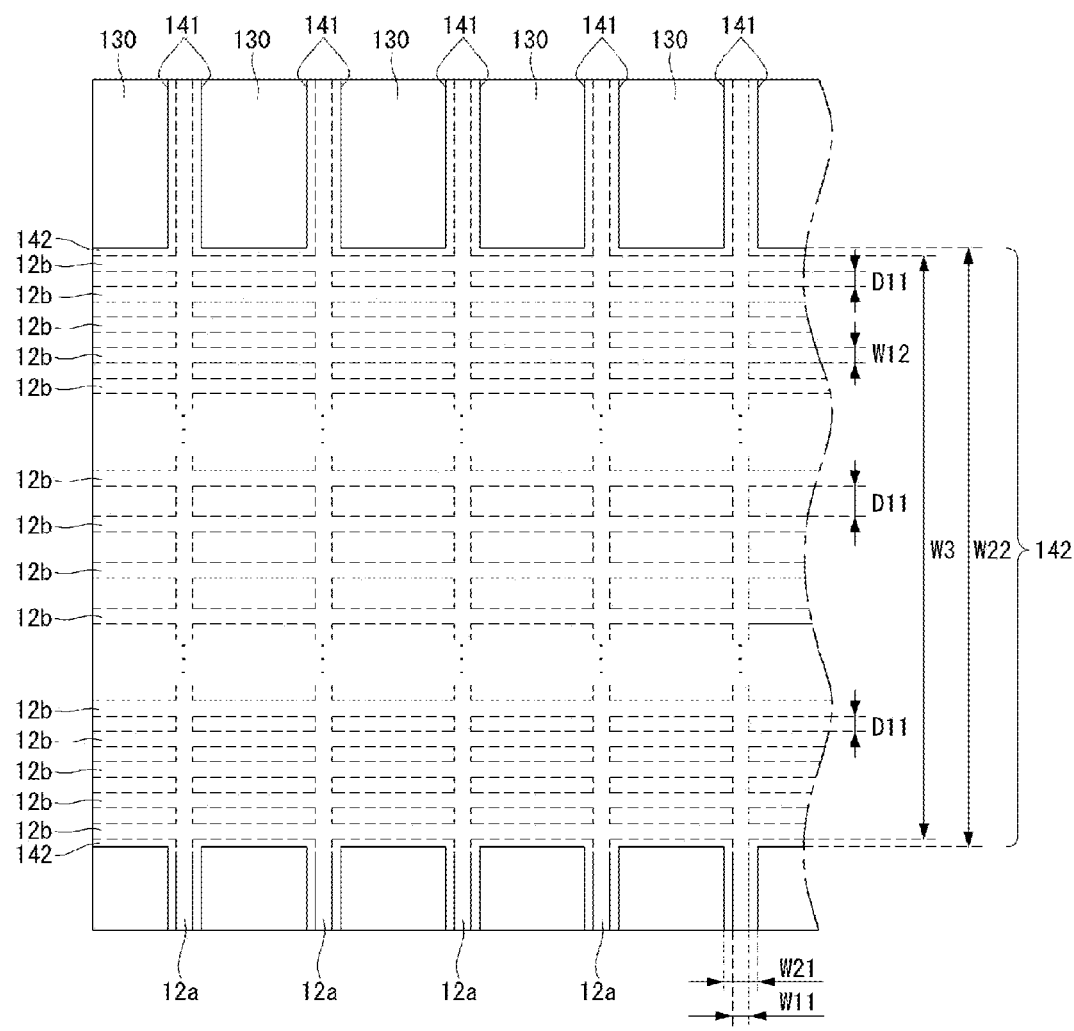

As shown in FIGS. 5 and 6, the second emitter part 12a for each electrode lengthily extends in the same direction as the front electrode 141 along the front electrode 141 under the front electrode 141. Thus, the second emitter part 12a for one electrode exists in each of the front electrodes 141.

The second emitter part 12b for each bus bar extends in the same direction as the front bus bar 142 along the front bus bar 142 under the front bus bar 142. The second emitter parts 12b for the bus bars are spaced apart from one another. Accordingly, the first emitter part 1211 exists between the second emitter parts 12b for adjacent bus bars.

As shown in FIG. 1, the direction in which the plurality of front electrodes 141 extends and the direction in which the plurality of front bus bars 142 extends cross each other. Thus, the plurality of front electrodes 141 and the plurality of front bus bars 142 are interconnected at parts where the plurality of front electrodes 141 and the plurality of front bus bars 142 cross each other. Accordingly, the second emitter parts 12a for the electrodes and the second emitter parts 12b for the bus bars, extending in the same direction as the plurality of front electrodes 141 and the plurality of front bus bars 142 under the plurality of front electrodes 141 and the plurality of front bus bars 142, respectively, are interconnected at parts where the second emitter parts 12a for the electrodes and the second emitter parts 12b for the bus bars cross each other.

When the parts where the plurality of front electrodes 141 and the plurality of front bus bars 142 cross each other are excluded, the plurality of second emitter parts 1212 [i.e., the second emitter parts 12b for the bus bars] spaced apart from one another exists under each of the front bus bars 142. In the present embodiment, an interval D11 between the second emitter parts 12b for two adjacent bus bars may be 15 μm to 30 μm.

In the solar cell 1 of the present embodiment, as shown in FIGS. 1 and 2 and 5 and 7, the interval D11 between the second emitter parts 1212 [i.e., the second emitter parts 12b for the bus bars] placed under each of the front bus bars 142 is regular.

Figure 8:
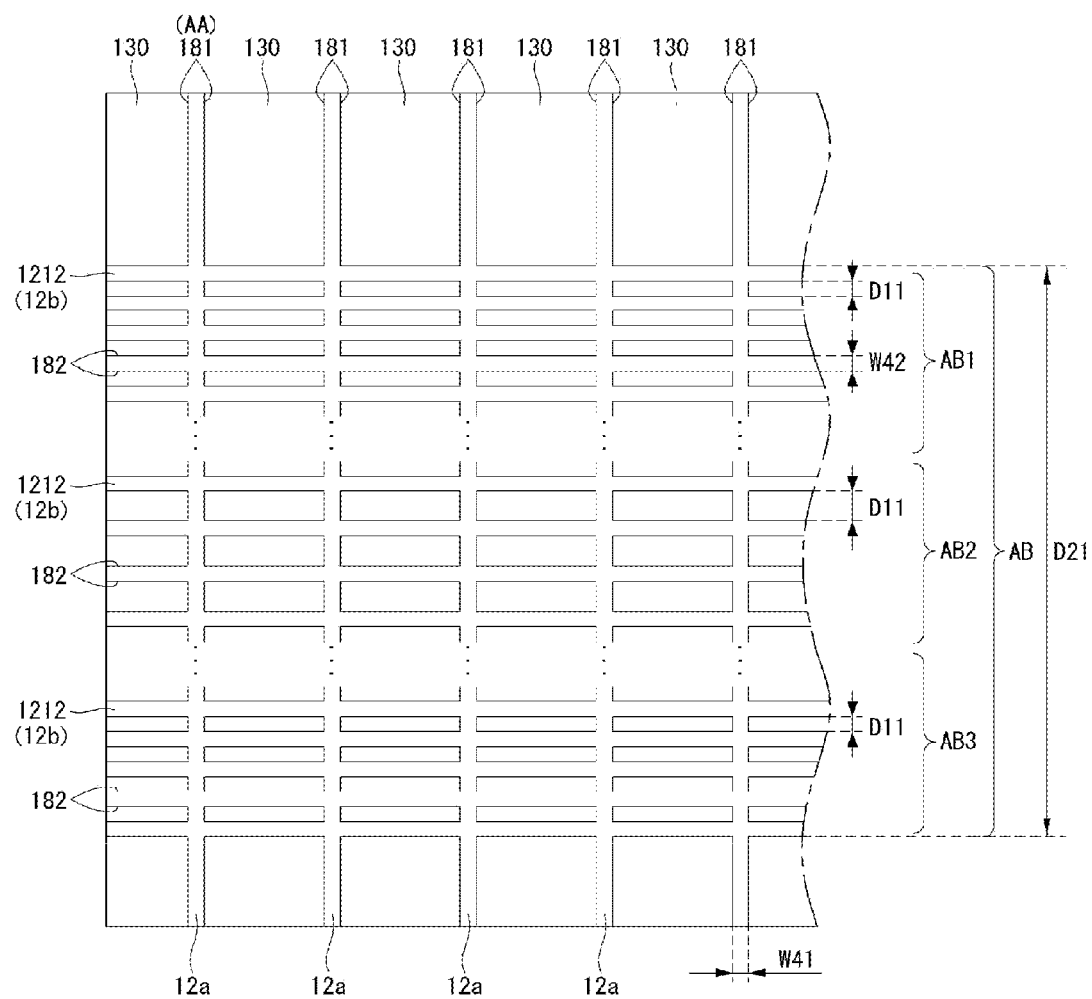

In another embodiment, however, as shown in FIGS. 6 and 8, the interval D11 between the second emitter parts 1212 [i.e., the second emitter parts 12b for the bus bars] placed under each of the front bus bars 142 is different.

For example, as shown in FIGS. 6 and 8, the interval D11 between the second emitter parts 12b for the bus bars that are placed at a central part of a width W3 where the plurality of second emitter parts 12b for the bus bars corresponding to each of the front bus bars 142 are formed may be greater than the interval D11 between the second emitter parts 12b for the bus bars that are placed at edge parts of the width W3 where the plurality of second emitter parts 12b for the bus bars corresponding to each of the front bus bars 142 are formed.

In this case, the interval D11 between the second emitter parts 12b for the bus bars that are placed at the central part of the width W3 where the plurality of second emitter parts 12b for the bus bars corresponding to each of the front bus bars 142 are formed may be the same. The interval D11 between the second emitter parts 12b for the bus bars that are placed at the edge parts of the width W3 where the plurality of second emitter parts 12b for the bus bars corresponding to each of the front bus bars 142 are formed may be the same.

Here, the interval D11 between the second emitter parts 12b for the bus bars that are placed at the central part of the width W3 where the plurality of second emitter parts 12b for the bus bars corresponding to each of the front bus bars 142 are formed may be about 1.5 to 5 times the interval D11 between the second emitter parts 12b for the bus bars that are placed at the edge parts of the width W3 where the plurality of second emitter parts 12b for the bus bars corresponding to each of the front bus bars 142 are formed.

The present invention is, however, not limited to the above example. For example, the interval D11 between the second emitter parts 12b for two adjacent bus bars may be different irrespective of a position of the width W3 where the plurality of second emitter parts 12b for the bus bars are formed.

In the present embodiment, the number of second emitter parts 1212 [i.e., the second emitter parts 12b for the bus bars] placed under each of the front bus bars 142 may be, for example, about 30 to 70 depending on the width of each of the second emitter parts 1212, the interval D11 between the second emitter parts 12b for two adjacent bus bars, and the width of each of the second emitter parts 12b.

Electrons, from among electrons and holes (i.e., electric charges generated by light incident on the substrate 110 by a built-in potential difference due to the p-n junction formed between the substrate 110 and the emitter region 121), move toward an n type, and the holes move toward a p type. Accordingly, when the substrate 110 is a p type and the emitter region 121 is an n type, electrons move toward the emitter region 121, and holes move toward the back surface of the substrate 110.

The emitter region 121, together with the substrate 110, forms the p-n junction. Unlike in the above, when the substrate 110 has an n type conductive type, the emitter region 121 has a p type conductive type. In this case, electrons move toward the back surface of the substrate 110, and holes move toward the emitter region 121.

When the emitter region 121 has an n type conductive type, impurities of a group V element may be doped into the emitter region 121. When the emitter region 121 has a p type conductive type, impurities of a group III element may be doped into the emitter region 121.

When the first emitter part 1211 has a surface resistance value of about 80 Ω/sq. or higher to about 120 Ω/sq. or lower, the amount of light absorbed by the first emitter part 1211 is further reduced. Thus, the amount of light incident on the substrate 110 is increased, and the loss of electric charges due to impurities is further reduced.

Furthermore, if the second emitter part 1212 has a surface resistance value of about 10 Ω/sq. or higher to about 50 Ω/sq. or lower, the loss of electric charges due to resistance during the movement of electric charges is reduced because specific contact resistivity between the second emitter part 1212 and the front electrode region 140 is reduced.

Since the first emitter part 1211 of the emitter region 121 is placed under the anti-reflection region 130 as described above, the anti-reflection region 130 is placed over the first emitter part 1211 of the emitter region 121. Accordingly, the first emitter part 1211 exists between the second emitter parts 12b for two adjacent bus bars, from among the second emitter parts 12b for the bus bars which are placed under each of the front bus bars 142. Thus, the anti-reflection region 130 exists over the first emitter part 1211 placed between the second emitter part 12b for adjacent bus bars.

The anti-reflection region 130 is composed of hydrogenated silicon nitrides (SiNx:H), hydrogenated silicon oxides (SiOx:H), hydrogenated silicon oxide nitrides (SiOxNy:H), or aluminum oxides (AlxOy).

The anti-reflection region 130 increases the efficiency of the solar cell 1 by reducing the reflectance of light incident on the solar cell 1 and increasing the selectivity of a specific wavelength region.

Furthermore, the anti-reflection region 130 plays a role of a passivation region that performs a passivation function of reducing the extinction of electric charges that have moved toward a surface of the substrate 110 owing to defects by changing defects, such as dangling bonds existing in the surface of the substrate 110 and peripheral parts thereof, into stable bonds through hydrogen (H) or oxygen (O) injected when the anti-reflection region 130 is formed. Thus, the efficiency of the solar cell 1 can be improved because the anti-reflection region 130 reduces the amount of electric charges lost in the surface of the substrate 110 and peripheral parts thereof owing to defects.

A top surface (i.e., a surface coming in contact with the front electrode region 140) of the anti-reflection region 130, as described above, includes the concave-convex surface having the plurality of first convex parts 21 and the plurality of second concave parts 22 owing to the textured surface (i.e., the concave-convex surface) of the substrate 110 placed under the anti-reflection region 130. Thus, the amount of light incident on the substrate 110 is increased.

Furthermore, the top surface of the anti-reflection region 130 partially comes in contact with the front electrode 141 and the front bus bar 142.

Figure 3A:
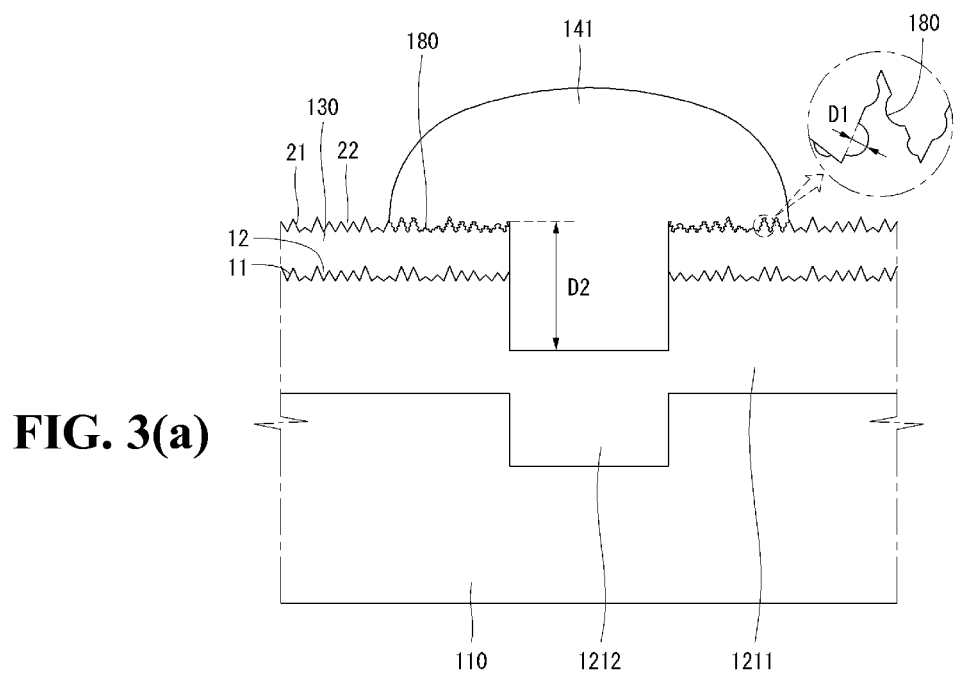
FIGS. 3(a) and 3(b) are respective diagrams showing enlarged parts of 'A' in FIG. 2.

The top surface of the anti-reflection region 130 coming in contact with the front electrode 141 and the front bus bar 142 includes a plurality of grooves 180 as shown in FIG. 3(a).

Each of the grooves 180 is placed in each of the convex parts 21 placed in the top surface of the anti-reflection region 130 that comes in contact with the front electrode region 140 and is formed by partially removing the anti-reflection region 130. The groove 180 is depressed by a specific thickness or depth D1 from the top surface of the anti-reflection region 130 toward the bottom surface of the anti-reflection region 130 (i.e., a surface placed on the side opposite to the top surface of the anti-reflection region 130 and coming in contact with the emitter region 121). In FIG. 3(a), the plurality of grooves 180 formed in the top surface of the anti-reflection region 130 is formed by partially removing only the anti-reflection region 130 and is placed within only the anti-reflection region 130.

Figure 3B:
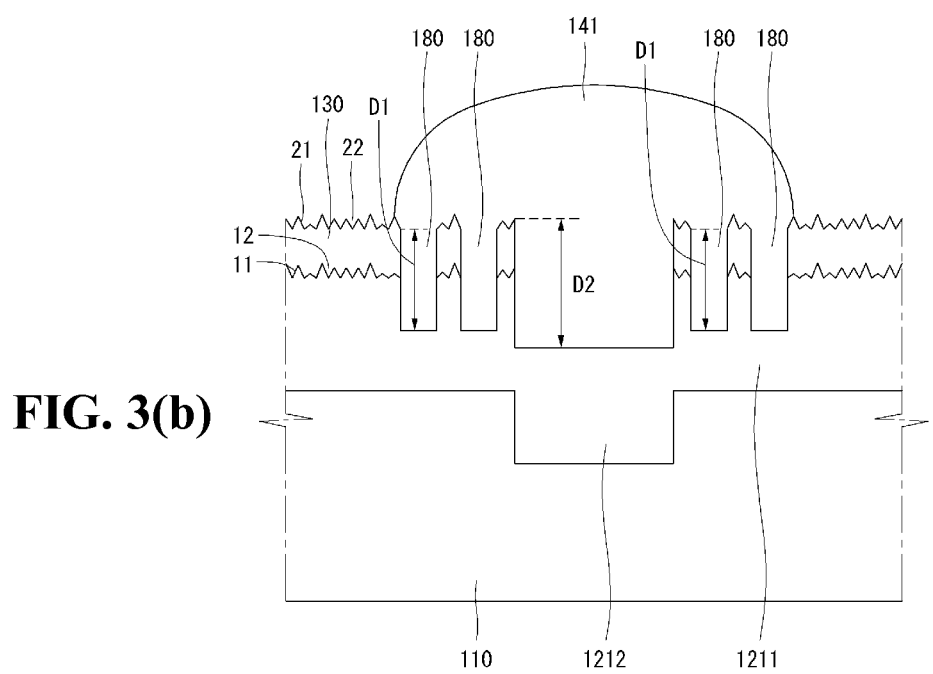

In another embodiment, however, as shown in FIG. 3(b), the plurality of grooves 180 formed in the anti-reflection region 130 coming in contact with the front electrode region 140 is formed by partially removing not only the anti-reflection region 130, but also the emitter region [i.e., the first emitter part 1211] under the anti-reflection region 130. Accordingly, the anti-reflection region 130 or the first emitter part 1211 of the emitter region 121 is exposed through the grooves 180.

In FIG. 3(b), the depth D1 of each of the grooves 180 is greater than the depth D1 shown in FIG. 3(a).

The plurality of grooves 180 may be formed at desired positions by radiating a laser beam. The depth D1 of each of the grooves 180 may change depending on the intensity of the laser beam.

In the present embodiment, the depth D1 of each groove 180 may be a maximum value of depths that are measured in parallel to the side of the grooves 180 from a virtual line formed in each of the grooves 180 when the convex parts placed near the groove 180 are connected in a straight line.

In the present embodiment, when only the anti-reflection region 130 is exposed through each of the grooves 180 as shown in FIG. 3(a), each of the depth D1 and diameter of each of the grooves 180 may be about 300 nm to 10 μm. When the emitter region 121 is exposed through the grooves 180 as shown in FIG. 3(b), each of the depth D1 and diameter of each of the grooves 180 may be about 70 nm to 120 nm.

The grooves 180 may have a stripe form in which the grooves 180 extend in the same direction along the second opening regions 182 in parallel to the second opening regions 182 or may be a circle or an oval.

In the present embodiment, the anti-reflection region 130 is illustrated to have a single film structure, but may have a multi-layered film structure, such as a dual film or may be omitted, if appropriate.

The front electrode region 140, including the plurality of front electrodes 141 and the plurality of front bus bars 142, is placed over the emitter region 121 and the anti-reflection region 130 and is connected to the second emitter parts 1212 of the emitter region 121.

Accordingly, the anti-reflection region 130 includes a plurality of first opening regions 181 and a plurality of second opening regions 182. The plurality of first opening regions 181 is formed by partially removing the anti-reflection region 130 in order to connect each of the front electrodes 141 and each of the second emitter parts 12a for the electrodes of the second emitter part 1212 and is formed to expose the second emitter parts 12a for the electrodes, respectively, under the plurality of first opening regions 181. The plurality of second opening regions 182 is formed by partially removing the anti-reflection region 130 in order to connect each of the front bus bars 142 and each of the second emitter parts 12b for the bus bars of the second emitter part 1212 and is formed to expose the second emitter parts 12b for the bus bars, respectively, under the plurality of second opening regions 182.

The plurality of first and second opening regions 181 and 182 may be formed by radiating a laser beam to relevant positions of the anti-reflection region 130.

Both sides of each of the second emitter parts 12a and 12b exposed through the first opening region 181 and the second opening region 182, respectively, may have a plane as shown in FIG. 4(a) or may have a concave-convex surface (i.e., a non-plane) as shown in FIG. 4(b).

When both sides of the second emitter parts 12a and 12b exposed through the first opening region 181 and the second opening region 182, respectively, have planes, a laser beam LB used may have a stripe form that has the same width as each of the first and the second opening regions 181 and 182. When both sides of each of the second emitter parts 12a and 12b exposed through the first opening region 181 and the second opening region 182, respectively, have planes, a laser beam LB used may have a spot form that has the same width as each of the first and the second opening regions 181 and 182.

When both sides of each of the second emitter parts 12a and 12b exposed through the first opening region 181 and the second opening region 182, respectively, have the concave-convex surfaces, the contact area of the front electrode 141 and the second emitter part 12a and the contact area of the front bus bar 142 and the second emitter part 12b are increased because the area of each of the second emitter parts 12a and 12b exposed through the first and the second opening regions 181 and 182 is increased. When the first and the second opening regions 181 and 182 are formed by using the laser beam LB having a stripe form, the time taken to form the first and the second opening regions 181 and 182 is reduced.

Figure 7:
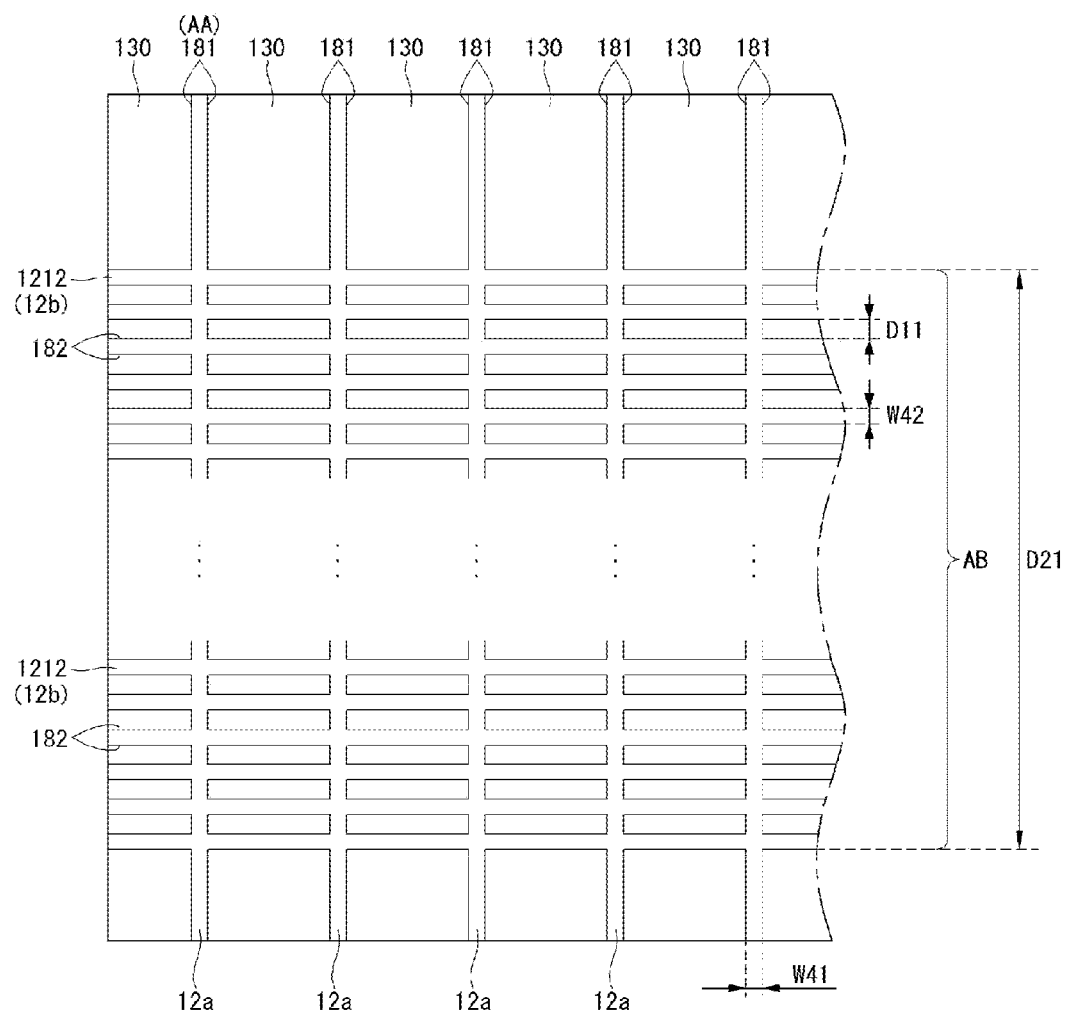
FIGS. 7 and 8 are schematic plan views each showing a plurality of first and second opening regions formed in an anti-reflection region according to the present embodiment.

As shown in FIGS. 7 and 8, the width W41 of the first second opening region 181 is identical with the width W42 of the second opening region 182. Each of the width W41 of the first second opening region 181 and the width W42 of the second opening region 182 may be about 5 μm to about 15 μm.

The plurality of first opening regions 181 is opening regions for forming the plurality of front electrodes 141 (i.e., opening regions for the front electrodes), and the plurality of second opening regions 182 is opening regions for forming the plurality of front bus bars 142 (i.e., opening regions for the front bus bars).

Each of the first opening regions 181 is the opening region for each of the front electrodes 141. Thus, the number of first opening regions 181 formed in a formation region (hereinafter referred to as a 'front electrode formation region' or a 'first electrode formation region') AA where one front electrode 141 is formed in the anti-reflection region 130 is one. Accordingly, the number of first opening regions 181 is the same as the number of front electrodes 141.

Unlike in the plurality of front electrodes 141, in order to form one front bus bar 142 having a width of about 1 mm to 1.5 mm, the second opening regions 182 of about 30 to about 70 in number are required. Thus, the number of second opening regions 182 formed in a formation region (hereinafter referred to as a 'front bus bar formation region' or a 'first bus bar formation region') AB where one front bus bar 142 is formed in the anti-reflection region 130 is about 30 to about 70. Accordingly, the number of second opening regions 182 is much greater than the number of front bus bars 142.

In order to form one front bus bar 142 as described above, when the plurality of second opening regions 182 spaced apart from one another are formed instead of forming one second opening region 182 having at least the same width as one front bus bar 142, a total width of the plurality of second opening regions 182, formed under one front bus bar 142, to the width of the front bus bar formation region AB of the anti-reflection region 130 or the width W3 where the plurality of second emitter parts 12b for the bus bars corresponding to one front bus bar 142 are formed may be about 1:0.2 to 0.5.

As described above, the plurality of front electrodes 141 extend in parallel in a predetermined direction with them spaced apart from one another. Each of the front electrodes 141 is electrically and physically connected to each of the second emitter part 12a for the electrodes of the second emitter part 1212.

Each of the front electrodes 141 is placed over each of the second emitter parts 12a for the electrodes and is also partially placed over an adjacent anti-reflection region 130. Accordingly, as shown in FIGS. 5 and 6, the width W21 of each of the front electrodes 141 placed over each of the second emitter parts 12a for the electrodes is greater than the width W11 of each of the second emitter parts 12a. For example, the width W21 of each of the front electrodes 141 may be 20 μm to 40 μm.

Thus, each of the front electrodes 141 is electrically and physically connected to the second emitter part 1212 [i.e., the second emitter part 12a for the electrode].

The plurality of front electrodes 141 collects electric charges (e.g., electrons) that have moved to the second emitter parts 12a for the electrodes of the second emitter part 1212 through the first emitter part 1211 of the emitter region 121.

As described above, the number of first opening regions 181 through which the second emitter parts 12a for the electrodes are exposed in order to form one front electrode 141 may be one, and the number of second opening regions 182 through which the second emitter parts 12b for the bus bars are exposed in order to form one front bus bar 142 may be about 30 to 70.

In the present embodiment, a ratio of the total width of the plurality of second opening regions 182, formed under one front bus bar 142, to the width W3 where the plurality of second emitter parts 12b for the bus bars corresponding to one front bus bar 142 are formed may be about 1:0.2 to 0.5.

When the ratio of the total width of the plurality of second opening regions 182, formed under one front bus bar 142, to the width W3 where the plurality of second emitter parts 12b for the bus bars corresponding to one front bus bar 142 are formed is about 1:0.2 or higher, the front bus bar 142 with a desired width and desired conductivity can be obtained because one front bus bar 142 formed over the second emitter parts 12a for the bus bars exposed through the plurality of second opening regions 182 is formed more stably.

When the ratio of the total width of the plurality of second opening regions 182, formed under one front bus bar 142, to the width W3 where the plurality of second emitter parts 12b for the bus bars corresponding to one front bus bar 142 are formed is about 1:0.5 or lower, the time taken to form the plurality of second opening regions 182 can be further reduced and the area of the emitter region 121 exposed to heat in order to form the plurality of second opening regions 182 can be further reduced.

The plurality of front bus bars 142 is spaced apart from one another and is extended in parallel in a direction to cross the plurality of front electrodes 141. Each of the front bus bars 142 is electrically and physically connected to the second emitter parts 12b for the bus bars of the second emitter part 1212 that are exposed through the plurality of second opening regions 182.

Furthermore, since the anti-reflection region 130 is placed between the second emitter parts 12b for two adjacent bus bars, one front bus bar 142 is connected to not only the second emitter parts 1212 [i.e., the second emitter parts 12b for the bus bars], but also the anti-reflection region 130.

The first emitter part 1211 exists under the anti-reflection region 130 between the second emitter parts 12b for two adjacent bus bars as described above. Accordingly, not only the second emitter parts 1212 [i.e., the second emitter parts 12b for the bus bars], but also the first emitter part 1211 exist under the front bus bar 142.

Like in each of the front electrodes 141, the width W22 of each of the front bus bars 142 placed over the substrate 110 is greater than the total width W3 of the substrate 110 (i.e., the width where the plurality of second emitter parts for the bus bars is formed) in which the second emitter parts 12b for the bus bars exiting under one front bus bar 142 are placed [i.e., in FIG. 5, a distance from the most lateral side of the second emitter part 12b for the bus bar, placed at the top (i.e., the outermost corner), to the most lateral side of the second emitter part 12b for the bus bar placed at the bottom (i.e., the outermost corner), from among the second emitter parts 12b for the bus bars placed under one front bus bar 142]. For example, the width W22 of each of the front bus bars 142 may be 1 mm to 1.5 mm.

Consequently, each of the front bus bars 142 is electrically and physically connected to the second emitter parts 12a for the electrodes of the second emitter part 1212 and the second emitter parts 12b for the bus bars of the second emitter part 1212.

The plurality of front bus bars 142 is placed in the same layer as the plurality of front electrodes 141. As described above, the plurality of front bus bars 142 is electrically and physically connected to the relevant front electrodes 141 at points where the front bus bars 142 crosses the respective front electrodes 141.

Accordingly, as shown in FIGS. 1 and 3, the plurality of front electrodes 141 has a stripe form in which the plurality of front electrodes 141 extends in one direction (i.e., a first direction), such as a horizontal or vertical direction. Furthermore, the plurality of front bus bars 142 has a stripe form in which the plurality of front bus bars 142 extends in the other direction (i.e., a second direction), such as a vertical or horizontal direction to cross the plurality of front electrodes 141. Accordingly, the front electrode regions 140 are placed in the front surface of the substrate 110 in a lattice form.

The plurality of front bus bars 142 collects not only electric charges moved from the second emitter parts 1212 of the emitter region 121, but also electric charges collected by the plurality of front electrodes 141 and moved and sends the collected electric charges in a relevant direction.

Each of the front bus bars 142 has to collect electric charges collected by the plurality of front electrodes 141 to cross the front bus bar 142 and to move the electric charges in a desired direction. Accordingly, the width W22 of each of the front bus bars 142 is greater than the width W21 of each of the front electrodes 141.

As described above, the emitter region 121 has the selective emitter structure including the first and the second emitter parts 1211 and 1212. Thus, the first emitter part 1211 where the movement of electric charges to the front electrode region 140 is chiefly performed has a low impurity doping concentration, and the second emitter parts 1212 coming in contact with the front electrode region 140 has a high impurity concentration. Accordingly, the amount of electric charges that are moved from the second emitter parts 1212 to the front electrode region 140 is increased owing to an increase of conductivity due to an increased amount of electric charges, moved toward the front electrode region 140 through the first emitter parts 1211 of the emitter region 121, and an increased impurity concentration. Consequently, the efficiency of the solar cell 1 can be significantly improved because the amount of electric charges collected by the front electrode region 140 in the emitter region 121 is increased.

In addition, the second emitter part 1212 that outputs electric charges by chiefly coming in contact with the front electrodes 141 and the front bus bars 142 of the front electrode region 140 has higher conductivity than the first emitter part 1211 and a lower surface resistance value than the first emitter part 1211 owing to the high impurity doping concentration. Consequently, the transmission efficiency of electric charges that are moved from the second emitter parts 1212 to the front electrode region 140 can be improved because specific contact resistivity between the second emitter parts 1212 and the front electrode region 140 is reduced.

Here, an area where the second emitter parts 12a for the electrodes are formed (i.e., a high concentration impurity doping region) is reduced because the width W11 of each of the second emitter parts 12a for the electrodes of the second emitter part 1212 is smaller than the width W21 of each of the front electrodes 141. Furthermore, the width W3 where the plurality of second emitter parts 12b for the bus bars are formed is smaller than the width W22 of each of the front bus bars 142. In addition, each of the front bus bars 142 fully comes in contact with the second emitter part 1212, but each of the front bus bars 142 is partially connected to the second emitter parts 12b for the bus bars (i.e., a high concentration impurity doping region). Thus, an area where the high concentration impurity doping region [i.e., the second emitter parts 12b for the bus bars] formed under each of the front bus bars 142 is formed can be reduced. Consequently, the efficiency of the solar cell 1 is improved because the high concentration impurity doping region 1212 is reduced in the emitter region 121 and thus the amount of electric charges lost by impurities is greatly reduced.

In order to fabricate one solar cell module by connecting the plurality of solar cells 1 in series or in parallel, an interconnector, such as a ribbon, is placed in the plurality of front bus bars 142. In the present embodiment, a conductive adhesion film is placed between the plurality of front bus bars 142 and the interconnector, so that the plurality of front bus bars 142 and the interconnector are coupled electrically and physically. Since the plurality of front bus bars 142 is connected to an external device through the interconnector, electric charges (e.g., electrons) collected by the plurality of front bus bars 142 are outputted to the external device via the interconnector.

As described above, each of the front electrodes 141 and each of the front bus bars 142 are placed over not only the second emitter parts 12a for the electrodes and the second emitter parts 12b for the bus bars, but also the anti-reflection region 130. Thus, the width of each of the front electrodes 141 and each of the front bus bars 142 is greater than the width of each of the opening regions 181 and 182. Consequently, since the surface area and cross section of each of the front electrodes 141 and each of the front bus bars 142 are increased, the conductivity of each of the front electrodes 141 and each of the front bus bars 142 can be stably maintained, and thus electric charges can be stably moved. Furthermore, adhesive strength between each of the front bus bars 142 and the conductive adhesion film placed on the front bus bar 142 is further improved because the contact area with the front bus bar 142 comes in contact with the conductive adhesion film is increased.

As described above, the plurality of grooves 180 through which the anti-reflection region 130 or the first emitter parts 1211 of the emitter region 121 are exposed is formed in the parts of the anti-reflection region 130 where the anti-reflection region 130 comes in contact with the front electrode 141 and the front bus bar 142 of the front electrode region 140. Accordingly, the front electrode 141 and the front bus bar 142 placed over the anti-reflection region 130 are also formed within the plurality of grooves 180.

Consequently, an area where the front electrode 141 and the front bus bar 142 come in contact with the anti-reflection region 130 and the emitter region 121, placed under the front electrode 141 and the front bus bar 142, is increased. Thus, adhesive strength between the front electrodes 141, and the anti-reflection region 130 and the emitter region 121 under the front electrodes 141 and adhesive strength between the front bus bars 142, and the anti-reflection region 130 and the emitter region 121 under the front bus bars 142 are increased. Accordingly, physical bonding strength between the front electrodes 141, and the anti-reflection region 130 and the emitter region 121 under the front electrodes 141 and physical bonding strength between the front bus bars 142, and the anti-reflection region 130 and the emitter region 121 under the front bus bars 142 are improved.

In the present embodiment, the front electrode region 140 is formed using a plating method. To this end, after the plurality of first and second opening regions 181 and 182 through which the emitter regions 121 are exposed is formed in the anti-reflection region 130, plating is performed on the emitter regions 121 exposed through the plurality of first and second opening regions 181 and 182 by using an electroplating method.

Figure 9:
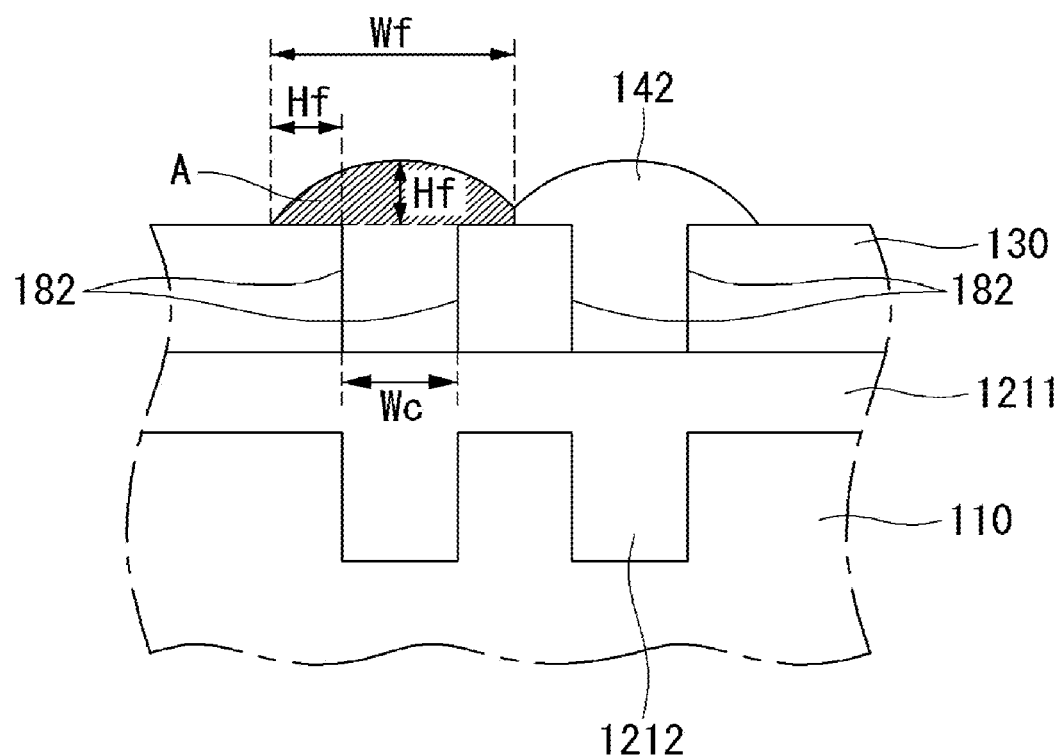
FIG. 9 is a schematic cross-sectional view showing part of front bus bars plated over second emitter parts exposed through the second opening regions according to the present embodiment.

The characteristics of the front electrodes 141 and the front bus bars 142 when the front electrode region 140 is fabricated using the plating method are described below with reference to FIGS. 9 and 10. In FIGS. 9 and 10, a surface of the substrate 110 is illustrated to have a plane not a textured surface, for simplicity.

As shown in FIG. 9, when the second opening regions 182 [or the plurality of first opening regions 181] each having a predetermined width Wc are formed by removing the anti-reflection region 130 and plating is performed on the exposed second emitter parts 1212, a plated thickness from the height of the top surface of the anti-reflection region 130 is Hf. As described above, since the plating is isotropic growth, a thickness plated on the anti-reflection region 130 in a horizontal direction from the end of the second opening region 182 [or the first opening region 181] is also Hf. Accordingly, a top surface of the part plated on the second emitter part 1212 exposed through the second opening region 182 [or the first opening region 181] has a curved surface shape.

Figure 10A:
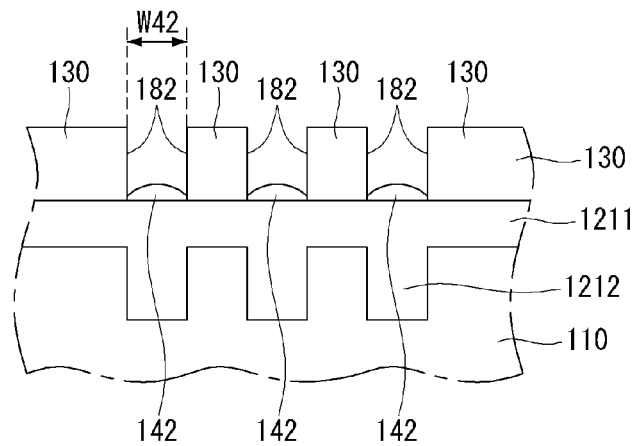
FIGS. 10(*a*) to 10(*c*) are schematic cross-sectional views showing a process of forming the front bus bars by performing plating on the second emitter parts exposed through the second opening regions according to the present embodiment.

Accordingly, when the plating is performed, metal plating is performed in the second emitter part 1212 placed in each of the second opening regions 182 and each of the first opening regions 181 (not shown in FIG. 9) is performed as shown in FIG. 10(a), so that desired metal is grown. Thus, as the front electrode region 140 including the plurality of front electrodes 141 and the plurality of front bus bars 142 starts being formed, the front electrodes 141 and the front bus bars 142 are gradually grown outside the first and the second opening regions 181 and 182.

Figure 10B:
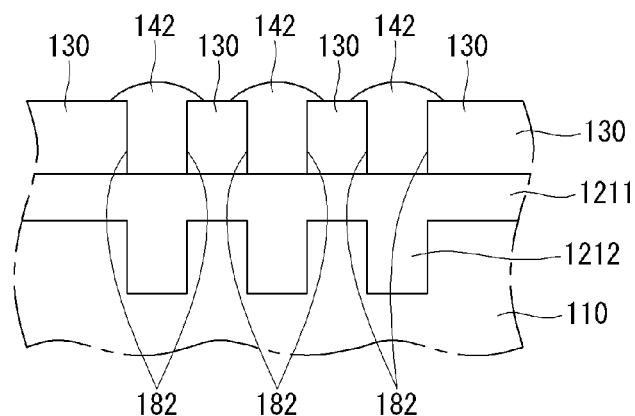

Here, the plating growth of metal for the front electrode regions 140, as described above, is isotropic growth performed in the same speed not only in a vertical direction, but also in a horizontal direction. Thus, when the front electrodes 141 and the front bus bars 142 grown within the first and the second opening regions 181 and 182 are grown to the height of the top surface of the adjacent anti-reflection region 130 as shown in FIG. 10(b), metal is also grown even in the horizontal direction, so that the front electrodes 141 and the front bus bars 142 are also grown over the anti-reflection region 130 adjacent to the first and the opening regions 181 and 182.

Accordingly, each of the top surface of each of the front electrodes 141 and the top surface of each of the front bus bars 142 has a curved surface shape.

Figure 10C:
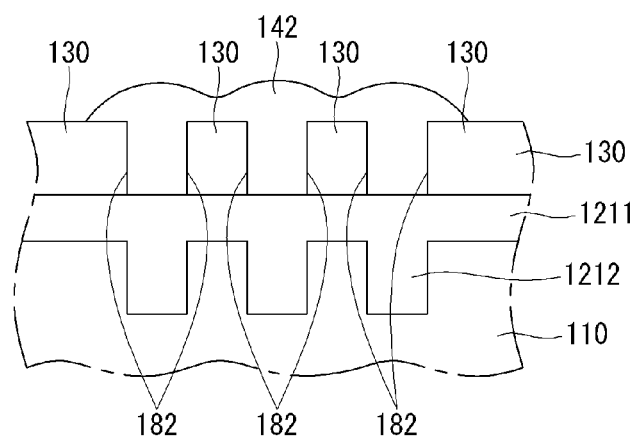

In the present embodiment, the plurality of adjacent opening regions 182 is formed in order to form one front bus bar 142. Accordingly, metal (i.e., part of each of the front bus bars 142) grown in each of the two second opening regions 182 adjacent to each other, from among the plurality of second opening regions 182 formed to form the one front bus bar 142, meet each other over the anti-reflection region 130 as shown in FIG. 10(c).

Consequently, although metal plating growth is performed within each of the second opening regions 182 spaced apart from each other, the interval D11 between the two adjacent second opening regions 182 is included within a range of the metal plating growth in the horizontal direction. Thus, the metals respectively grown around the two adjacent second opening regions 182 meet each other over the anti-reflection region 130 placed between the two second opening regions 182, thereby forming the one front bus bar 142.

Accordingly, the width of each of the front bus bars 142 finally formed [i.e., the width of a bottom surface of each of the front bus bars 142 coming in contact with the anti-reflection region 130 and the second emitter part 1212] is greater than the width D21 of the front bus bar formation region AB.

Since the metal plating growth is isotropic growth as described above, a top surface [i.e., a surface of the front bus bar 142 placed on the opposite side to the bottom surface] of the metal (i.e., part of the front bus bar 142) plated on the basis of each of the second opening regions 182 also has a curved surface shape. Metal plating is performed on the basis of each of the two adjacent second opening regions 182 and is overlapped with the anti-reflection region 130 placed between the two adjacent second opening regions 182. Thus, the height of the top surface of the overlapping part of the metal grown by plating becomes higher than the height of the top surface of the metal part grown by plating on second emitter part 1212 exposed through the second opening region 182.

Accordingly, the top surface [i.e., the surface of the front bus bar 142 placed on the opposite side to the bottom surface] of each of the front bus bars 142, formed on the anti-reflection region 130 and on the second emitter part 1212 that are exposed through the second opening region 182 has a curved surface shape including the concave-convex surface having the plurality of convex parts and the plurality of concave parts. As described above, the height of the top surface of the front bus bar 142 placed on the second emitter part 1212 exposed through the second opening region 182 is higher than the height of the front bus bar 142 placed on the anti-reflection region 130.

Accordingly, a contact area where each of the front bus bars 142 comes in contact with the interconnector is increased because the surface roughness of the top surface of each of the front bus bars 142 is increased. Thus, the amount of electric charges moving from the front bus bars 142 to the interconnector is increased.

As shown in FIGS. 6 and 8, when the interval D11 between the second emitter parts 12b for the bus bars placed under each of the front bus bars 142 is different according to a position, the overlapping area of a part grown by plating on the second emitter part 12b for an adjacent bus bar at an edge part is more increased than the overlapping area of a part grown by plating on the second emitter part 12b for an adjacent bus bar in the central part of each of the front bus bars 142. Accordingly, a difference in the height between the central part and the edge part of each of the front bus bars 142 is reduced, and thus the flatness of the top surface of each of the front bus bars 142 (i.e., the concave-convex surface including the plurality of convex parts and the plurality of concave parts) is further increased. Consequently, an adhesion operation with the conductive adhesion film placed over each of the front bus bars 142 is facilitated, and adhesive strength is increased.

Each of the front electrodes 141 not having the plurality of convex parts and the plurality of concave parts has a smooth curved surface shape because it is formed using one first opening region 181.

In FIG. 9, the total width Wf of the plated front bus bar 142 is Wc+2Hf. Since the plated metal [e.g., silver (Ag)] has specific line resistivity of about 2.2 u$\Omega$cm, it can be seen that the specific line resistivity of the plated metal is about ⅓ of specific line resistivity (i.e., about 6.7 u$\Omega$cm) of the front bus bar made of silver (Ag) paste. The plated material has specific contact resistivity of about 1 m$\Omega$cm. It can also be seen that the specific contact resistivity of the plated material is about ⅓ of specific contact resistivity (i.e., about 3 m$\Omega$cm) when silver (Ag) paste is used.

As described above, each of the specific line resistivity value and the specific contact resistivity value of the front bus bar 142 fabricated using plating is about ⅓ of each of the specific line resistivity value and the specific contact resistivity value of the front bus bar fabricated using silver (Ag) paste. If the front bus bar 142 fabricated using the plating method and the front bus bar 142 fabricated using silver (Ag) paste have the same cross section, it can be seen that the operating characteristic (e.g., contact characteristic or conductivity) of the front bus bar fabricated using plating is about 3 times the operating characteristic of the front bus bar fabricated using silver (Ag) paste.

In FIG. 9, When Wc is 10 μm and Hf is 10 μm, a cross section A of part of the front bus bar 142 grown by plating in one second opening region 182 is about 257 μm$^2$.

A cross section A1 of one front bus bar 142 having the same line resistance as the front bus bar 142 fabricated using silver (Ag) paste may be calculated on the basis of an equation; R (line resistance)=[ρ (specific line resistivity)×l (length)]/A1 (cross section). In the equation, a factor for the length l is omitted because the front bus bar fabricated using silver (Ag) paste has the same length l as the front bus bar 142 fabricated using plating.

Assuming that line resistance of the front bus bar fabricated using silver (Ag) paste is Rpaste, Rpaste=6.7/37500=1.786×10$^{-4}$$\Omega$ because the specific line resistivity is 6.7 u$\Omega$cm and the cross section is 37,500 μm$^2$ as described above.

Accordingly, when line resistance Rplating of the front bus bar fabricated using plating is identical with the line resistance Rpaste of the front bus bar fabricated using silver (Ag) paste, the cross section A1 is calculated according to the following equation. Here, the front bus bar 142 fabricated using plating has specific line resistivity of 2.2 u$\Omega$cm as described above.

In (Rplating=ρ/A1), the cross section A1 is about 12,313 μm$^2$ because 1.786×10$^{-4}$$\Omega$=2.2/A1.

Accordingly, when the cross section A1 is divided by the cross section A of the part grown by plating in one opening region 182, the number of second opening regions 182 formed in the anti-reflection region 130 in order to obtain the cross section A1 is calculated, and thus the number of second opening regions 182 each having a width of about 10 μm may be about 48.

In other words, in order to form one front bus bar 142 having a width of about 1.5 mm, about 48 opening regions 182 each having a width of about 10 μm are formed instead of forming one second opening region having a width of about 1.5 mm in the anti-reflection region 130, and the front bus bar 142 is formed by plating within the second opening region 182. In this case, the width of each of the front bus bars 142 formed on the plurality of second opening regions 182 is about 1.5 mm because the plating of the front bus bars 142 is isotropically grown not only over the second opening regions 182, but also in the left and right directions as described above.

It can be seen that about 30 to 70 second opening regions 182 each having a width of about 5 μm to 15 μm are necessary to form one front bus bar 142 having a width of about mm 1 to 1.5 mm over the emitter region 121, exposed through the plurality of second opening regions 182, by using the plating method. Here, an interval between two adjacent second opening regions 182 may be about 15 μm to 30 μm. The number of second opening regions 182 is changed according to the width of the second opening region 182 and the interval between the two adjacent second opening regions 182.

When the interval between the two adjacent second opening regions 182 is about 15 μm or higher, the loss of electric charges due to the second emitter parts 12b for the bus bars of the second emitter part 1212 is stably reduced because an area where the second emitter part 12b (i.e., a high concentration impurity doping part) is formed is reduced. When the interval between the two adjacent second opening regions 182 is about 30 μm or higher, one front bus bar 142 having stable conductivity is formed on the plurality of second opening regions 182 because the front bus bars 142 grown in adjacent second opening regions 182, respectively, come in contact with the adjacent second opening regions 182 more stably.

As described above, in order to form each of the front bus bars 142, the anti-reflection region 130 of a part where one front bus bar 142 will be placed is removed partially or selectively, instead of removing the entire anti-reflection region 130 of a part where one front bus bar 142 will be placed by using a laser in order to form each of the front bus bars 142. Accordingly, the area of the anti-reflection region 130 to which the laser beam is radiated is reduced.

Accordingly, there are advantages in that the time taken to fabricate the solar cell 1 and a change in the characteristic of the solar cell 1 are reduced because the time taken to radiate a laser beam and a phenomenon in which the emitter region 121 or the substrate 110 is deteriorated by heat applied by the laser beam are reduced.

In the present embodiment, when the number of second opening regions 182 for one front bus bar 142 is 30 or greater, the front bus bars 142 having a more stable conductivity and surface area are formed. When the number of second opening regions 182 for one front bus bar 142 is 70 or smaller, an unnecessary waste of time and the radiation area of a laser are reduced.

Furthermore, the width of each of the first and the second opening regions 181 and 182 is more reduced than that when etch paste or an additional mask is used because a desired part of the anti-reflection region 130 is removed by using a laser beam directly radiated over the anti-reflection region 130, instead of using an operation of removing the anti-reflection region 130 using the etch paste or mask.

Accordingly, an area where the plurality of front electrodes 141 is formed is reduced because an area where the second emitter part 1212 (i.e., a high concentration impurity doping part) is reduced and the width of the front electrode 141 is reduced.

Figure 11:
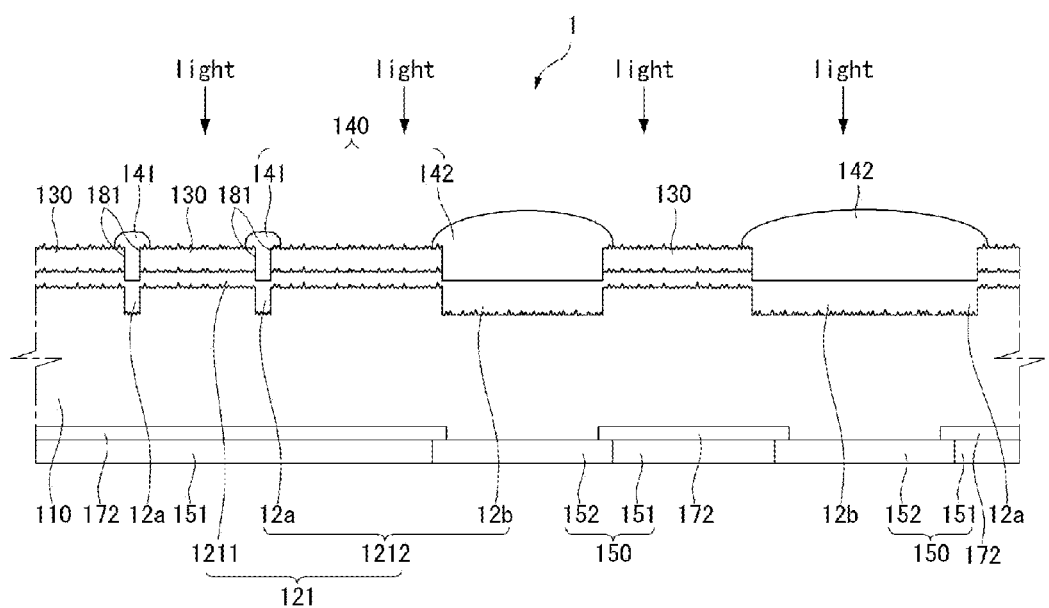
FIG. 11 is a partial cross-sectional view of another example of a solar cell according to an embodiment of the present invention.

In a solar cell 1 according to an alternative embodiment, as shown in FIG. 11, the number of second opening regions 182 through which the second emitter part 12b for the bus bar of the second emitter part 1212 is exposed in order to form one front bus bar 182 may be one.

In this case, since a contact area where each of the front bus bars 142 comes in contact with the second emitter part 12b for the bus bar of the second emitter part 1212 is increased, adhesive strength between the front bus bar 142 and the second emitter part 1212 is increased.

In this case, as in each of the front electrodes 141, one front bus bar 142 is made of material grown by plating in one opening regions 182 because only the second opening region 182 is necessary for the front bus bar 142. Accordingly, a top surface of the front bus bar 142 formed in the second opening region 182 has a curved surface shape like the top surface of each of the front electrodes 141, and the top surface of the front bus bar 142 has smaller roughness than the top surface of the front bus bar 142 formed through the plurality of second opening regions 182. Consequently, the flatness of the top surface of the front bus bar 142 is greater than the flatness of the top surface of the front bus bar 142 formed through the plurality of second opening regions 182.

In the present embodiment, the plurality of grooves 180 is not for a contact between the front electrode region 140 and the second emitter part 1212 of the emitter region 121, but it functions to enhance adhesive strength between the front electrode region 140 and elements placed under front electrode region 140. Accordingly, the depth D1 of each of the grooves 180 is not greater than the depth D2 of each of the first and the second opening regions 181 and 182, and the depths D1 and D2 of the grooves 180 and the opening regions 181 and 182 are varied depending on the intensity of a laser beam (i.e., the magnitude of a wavelength). Accordingly, the intensity of a laser beam radiated to form the plurality of first and second opening regions 181 and 182 may be different from the intensity of a laser beam radiated to form the plurality of grooves 180, and the intensity of the laser beam radiated to form the plurality of first and second opening regions 181 and 182 may be greater than the intensity of the laser beam radiated to form the plurality of grooves 180.

In the present embodiment, the wavelength of the laser beam used to form each of the plurality of first and second opening regions 181 and 182 and the plurality of grooves 180 may be about 350 nm to 1100 nm. For example, the laser beam used to form the plurality of first and second opening regions 181 and 182 may have a wavelength of 532 nm. The laser beam used to form the plurality of grooves 180 may have a wavelength of about 1100 nm. Furthermore, power of the laser beam for each of the first and the second opening regions 181 and 182 and the grooves 180 may be about 5 W to 20 W. The power, intensity (or wavelength), or radiation time of the laser beam may be determined depending on material or thickness of the anti-reflection region 130.

An electroplating method or a Light-Induced Plating (LIP) may be used as the plating method.

The plurality of front electrodes 141 and the plurality of front bus bars 142 have the same film structure and material because the front electrodes 141 and the front bus bars 142 are formed at the same time using the same plating process. Furthermore, since the front electrode region 140 is formed by plating, the density of the front electrode region 140 is much greater than the density of a front electrode region fabricated using a screen-printing method, such as silver (Ag) paste. Accordingly, the conductivity of the front electrode region 140 can be significantly improved.

The front electrode region 140 including the plurality of front electrodes 141 and the plurality of front bus bars 142 has been illustrated to have a single film structure made of material, such as silver (Ag). In an alternative embodiment, the front electrode region 140 may have a multi-film structure, such as a dual film or a triple film.

When the front electrode region 140 is a single film made of silver (Ag), the front electrode region 140 may have specific line resistivity of 1.6 uΩcm to 2.5 uΩcm. In this case, the specific line resistivity of the front electrode region 140 is much smaller than the specific line resistivity (i.e., about 6.7 uΩcm) of the front electrode region 140 made of silver (Ag) paste using a screen-printing method.

When the front electrode region 140 has a dual film structure, a lower film (i.e., a first film) coming in contact with the emitter region 121 (i.e. the second conductive type region of the substrate 110) may be made of nickel (Ni), and an upper film (i.e., a second film) placed on the lower film may be made of silver (Ag). When the front electrode region 140 has a triple film structure, a lower film (i.e., a first film) coming in contact with the emitter region 121 may be made of nickel (Ni), a middle film (i.e., a second film) placed on the lower film may be made of copper (Cu), and an upper film (i.e., a third film) placed on the middle film may be made of silver (Ag) or tin (Sn). When the front electrode region 140 is the dual film, the lower film may have a thickness of about 0.5 μm to about 1 μm and the upper film may have a thickness of about 5 μm to about 10 μm. When the front electrode region 140 is the triple film, each of the lower film and the upper film may have a thickness of about 0.5 μm to about 1 μm and the middle film may have a thickness of about 5 μm to about 10 μm.

Here, the lower film of each of the front electrodes 141 and each of the front bus bars 142 functions to improve a contact characteristic by reducing specific contact resistivity with the second emitter part 1212 coming in contact with the lower film and functions as a seed layer for plating. The middle film of each of the front electrodes 141 and each of the front bus bars 142 is for reducing costs and may be made of material having a low cost and excellent conductivity, such as copper (Cu). When the middle film is made of copper (Cu), the lower film placed under the middle film functions to prevent copper (Cu), having excellent bonding strength with silicon (Si), from functioning as impurities that penetrate into (or are absorbed by) the second emitter part 1212 made of silicon (Si) and thus hinder the movement of electric charges.

Furthermore, the upper film functions to prevent a film, placed under the upper film (e.g., the lower film or the middle film), from being oxidized and improve adhesive strength with a conductive adhesion film placed over the upper film.

When each of the front electrodes 141 and the front bus bars 142 is formed of the dual film or the triple film and the lower film is made of nickel (Ni) as described above, nickel silicide exists between the lower film and the emitter region 1212 owing to bond of nickel (Ni) and the emitter region 1212 (i.e., silicon (Si) forming the second conductive type region of the substrate 110).

Meanwhile, when the front electrodes 141 and the front bus bars 142 are made of silver (Ag) paste including glass frit by using a screen-printing method, the glass frit penetrates the anti-reflection region 130 and thus comes in contact with the emitter region 1212. Accordingly, at least one of components of the glass frit (e.g., at least one of material based on lead (Pb) such as PbO, material based on bismuth (Bi) such as $Bi_2O_3$, material based on aluminum (Al) such as $Al_2O_3$, material based on boron (B) such as $B_2O_3$, material based on tin (Sn) such as SnO, material based on zinc (Zn) such as ZnO, material based on titanium (Ti) such as TiO, and material based on phosphorus (P) such as $P_2O_5$) is detected in a part where the front electrode 141 and the front bus bar 142 come in contact with the emitter region 1212.

In the present embodiment, however, the components of the glass frit are not detected between the front electrode 141 and the front bus bar 142, and the substrate 110 [i.e., the emitter region 121] because the front electrode 141 and the front bus bar 142 are formed by plating. When the front electrode region 140 has the multi-layered film as described above, the multi-layered film having a desired thickness sequentially from the lower film to the upper film is formed using the plating method.

In FIG. 1, the number of front electrodes 141, the number of front bus bars 142, and the number of second emitter parts 1212 placed in the substrate 110 are only illustrative and may be changed according to circumstances.

The back surface field region 172 is an impurity region where impurities having the same conductive type as the substrate 110 are doped at a higher concentration than the impurity region of the substrate 110 and may be a p+ region.

A potential barrier is formed owing to a difference in the impurity concentration between the first conductive type region of the substrate 110 and the back surface field region 172, so that the potential barrier hinders holes from moving toward the back surface field region 172, but facilitates the movement of the holes toward the back surface field region 172. Accordingly, the amount of electric charges lost by a recombination of electrons and holes in the back surface of the substrate 110 and adjacent parts thereof is reduced, and the movement of desired electric charges (e.g., holes) is facilitated. Accordingly, the amount of electric charges moving toward the back electrode regions 150 is increased.

The back electrode region 150 includes the plurality of back electrodes 151 and the plurality of back bus bars 152 connected to the back electrodes 151.

The back electrode 151 comes in contact with the back surface field region 172 placed in the back surface of the substrate 110. The back electrodes 151 are substantially placed in the entire back surface of the substrate 110 other than the edges of the back surface of the substrate 110 and parts where the back bus bars 152 are placed.

The back electrode 151 includes conductive material, such as aluminum (Al) or silver (Ag).

The back electrode 151 collects electric charges (e.g., holes) moved toward the back surface field region 172.

Specific contact resistivity between the substrate 110 (i.e., the back surface field region 172) and the back electrode 151 is reduced because the back electrode 151 comes in contact with the back surface field region 172 having a higher impurity concentration than the substrate 110. Accordingly, the transmission efficiency of electric charges from the substrate 110 to the back electrode 151 is improved.

The plurality of back bus bars 152 is placed in the back surface of the substrate 110 where the back electrodes 151 are not placed and is connected to adjacent back electrodes 151.

Furthermore, the plurality of back bus bars 152 faces the respective front bus bars 142 on the basis of the substrate 110.

The plurality of back bus bars 152, likes the plurality of front bus bars 142, collects electric charges transferred from the back electrodes 151.

Like the plurality of front bus bars 142, the interconnector is placed on the plurality of back bus bars 152, and the plurality of back bus bars 152 is connected to an external device through the interconnector. Accordingly, electric charges (e.g., holes) collected by the plurality of back bus bars 152 are outputted to the external device. In this case, the conductive adhesion film is placed between the plurality of back bus bars 152 and the interconnector, thus electrically and physically coupling the plurality of back bus bars 152 and the interconnector.

The plurality of back bus bars 152 may be made of material having better conductivity than the back electrodes 151, and it includes at least one conductive material, such as silver (Ag). Accordingly, the back electrodes 151 and the back bus bars 152 may be made of different materials.

The back electrodes 151 may be formed by a screen-printing method using paste including aluminum (Al) or silver (Ag), and the back bus bars 152 may also be formed by a screen-printing method using paste including silver (Ag).

Furthermore, the back electrodes 151 and the back bus bars 152 may also be formed using a plating method like the front electrodes 141 and the front bus bars 142. In this case, like the front electrode region 140, the back electrodes 151 and the back bus bars 152 are formed at the same time using the same plating process, and thus the back electrodes 151 and the back bus bars 152 may be made of the same material. In addition, the back electrodes 151 and the back bus bars 152 may be formed simultaneously with the front electrodes 141 and the front bus bars 142 using a plating process for the front electrodes 141 and the front bus bars 142. In this case, the back electrode region 150 is made of the same material as the front electrode region 140. Furthermore, the back electrode region 150 may have not only a single film, but also a multi-film, such as a dual film or a triple film.

In the case in which the back electrodes 151 and the back bus bars 152 are formed by the plating method and the back electrodes 151 and the back bus bars 152 have a dual film or a triple film as described above, when the back surface field region 172 (i.e., a lower film coming in contact with the part of the substrate 110 into which impurities of the first conductive type have been doped at a high concentration) is made of nickel (Ni), nickel silicide exists between the lower film and the back surface field region 172 owing to a combination of nickel (Ni) and silicon (Si) in the back surface field region 172.

Furthermore, a component of glass frit (e.g., at least one of material based on lead (Pb) such as PbO, material based on bismuth (Bi) such as $Bi_2O_3$, material based on aluminum (Al) such as $Al_2O_3$, material based on boron (B) such as $B_2O_3$, material based on tin (Sn) such as SnO, material based on zinc (Zn) such as ZnO, material based on titanium (Ti) such as TiO, and material based on phosphorus (P) such as $P_2O_5$) is detected between the back electrode 151 and the back surface field region 172 and between the back bus bar 152 and the back surface field region 172.

Unlike in the present embodiment, in an alternative example, the emitter region 121 of the solar cell 1 may not have the selective emitter structure.

In this case, the emitter region 121 placed right under the anti-reflection region 130 has the same impurity doping concentration, impurity doping thickness, and surface resistance value as the emitter region 121 placed right under the front electrode region 140 because the anti-reflection region 130 is not placed. Accordingly, all the emitter regions 121 can have the same surface resistance value (e.g., about 50 Ω/sq. to 80 Ω/sq.) irrespective of their positions.

An operation of the solar cell 1 having the above structure according to the present embodiment is described below.

When light is radiated to the solar cell 1 and then incident on the substrate 110 via the anti-reflection region 130, electrons and holes are generated from the semiconductor region by the light energy. At this time, the amount of light incident on the substrate 110 is increased because the reflection loss of light incident on the substrate 110 is reduced by the anti-reflection region 130.

The electrons and holes are moved toward the emitter region 121 having the n type conductive type and the substrate 110 having the p type conductive type, respectively, by means of the p-n junction of the substrate 110 and the emitter region 121. The electrons are moved toward the emitter region 121 as described above move to the second emitter parts 1212 via the first emitter parts 1211, collected by the plurality of front electrodes 141 and the plurality of front bus bars 142, and then moved along the plurality of front bus bars 142. The holes moved toward the substrate 110 are collected by the back electrodes 151 and the plurality of back bus bars 152 adjacent to each other and are then moved along the plurality of back bus bars 152. When the front bus bars 142 and the back bus bars 152 are coupled by the interconnector, current flows, and the current is externally used as power.

In this case, the amount of electric charges moved toward the front electrodes 141 is increased because the amount of electric charges lost is reduced by the emitter region 121 having the selective emitter structure, so that the efficiency of the solar cell 1 is significantly improved.

Furthermore, since the front electrode region 140 is formed by the plating method, the width of each of the front electrodes 141 is much smaller than the width (e.g., 80 μm to 120 μm) of each of the front electrodes fabricated using silver (Ag) paste by a screen-printing method. Accordingly, the area of the solar cell 1 on which light is incident is increased because an area where the front electrodes 141 that hinder the incidence of light are formed is reduced. Consequently, the efficiency of the solar cell 1 is improved.

Furthermore, when the selective emitter structure is formed, the second emitter region 1212 (i.e., a high concentration impurity doping region) is not placed under the entire front bus bar 142, but is selectively placed under the front bus bar 142, and the width of each of the front electrodes 141 is smaller than the width of the second emitter region 1212 placed under the front bus bar 142. Accordingly, the high concentration impurity doping region is reduced, and thus the amount of electric charges lost by impurities is greatly reduced.

Furthermore, in the top surface of the anti-reflection region 130 including the first convex parts 21 and the first concave parts 22, contact areas where the front electrode 141 comes in contact with the anti-reflection region 130 and where the front electrode 141 comes in contact with the emitter region 121 and contact areas where the front bus bar 142 comes in contact with the anti-reflection region 130 and where the front bus bar 142 comes in contact with the emitter region 121 are increased by the plurality of grooves 180 placed in the parts where grooves 180 come in contact with the front electrode region 140. Accordingly, adhesive strength between the front electrode 141 and the anti-reflection region 130, placed under the front electrode 141, and between the front electrode 141 and the emitter region 121 and adhesive strength between the front bus bar 142 and the anti-reflection region 130, placed under the front bus bar 142, and between the front bus bar 142 and the emitter region 121 are improved.

A method of manufacturing the solar cell 1 according to an embodiment of the present invention is described below with reference to FIGS. 12a to 12g.

Figure 12A:
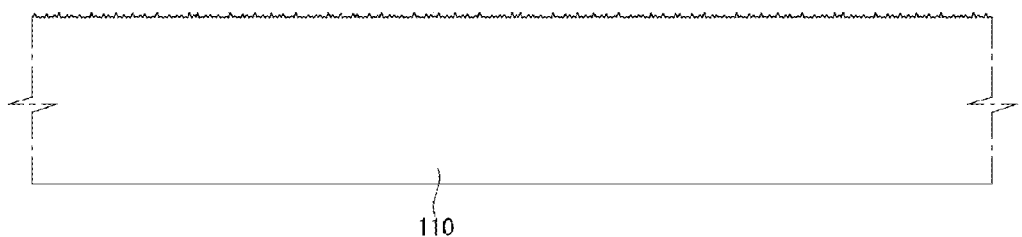
FIGS. 12*a* to 12*g* are diagrams sequentially showing a method of manufacturing the solar cell shown in FIGS. 1 and 2.

As shown in FIG. 12a, the textured surface (i.e., the concave-convex surface) including the plurality of convex parts and the plurality of concave parts is formed in the front surface (i.e., a plane) of the substrate 110, formed to have the first conductive type (e.g., the p type) and made of single crystalline silicon or polycrystalline silicon, by using a wet etch method or a dry etch method.

Figure 12B:
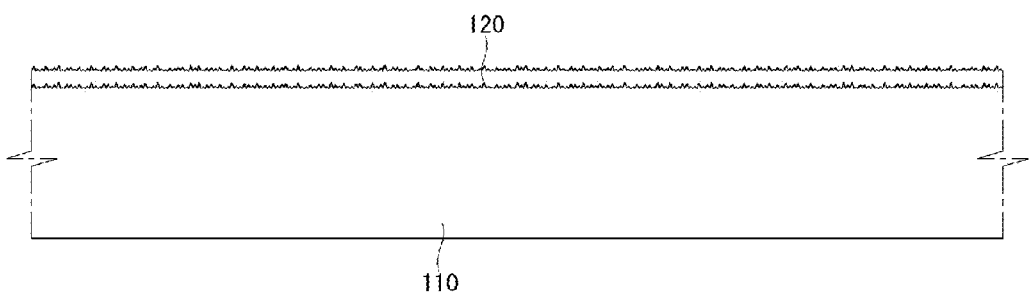

As shown in FIG. 12b, the emitter region 120 including impurities [e.g., phosphorus (P)] having the second conductive type is formed on the front surface side of the substrate 110 formed to have the first conductive type (e.g., the p type) and made of single crystalline silicon or polycrystalline silicon. Here, the emitter region 120 may be formed using an ion implantation method or a thermal diffusion method, and the first conductive type region of the substrate 110 and the p-n junction may be formed in the emitter region 120. The emitter region 120 may have a surface resistance value of about 80 Ω/sq. to 120 Ω/sq. Since the emitter region 120 is formed by implanting the impurities of the second conductive type into the substrate 110 as described above, the emitter region 120 is made of the same crystalline semiconductors as the substrate 110, such as single crystalline silicon or polycrystalline silicon. Accordingly, the substrate 110 and the emitter region 120 form a homogeneous junction.

In an alternative embodiment, before the emitter region 120 is formed or after the emitter region 120 is formed, the textured surface having the plurality of convex parts and the plurality of concave parts may be formed in the front surface (i.e., a plane) of the substrate 110 [or a surface of the emitter region 120] or the front surface and the back surface of the substrate 110 by using a dry etch method or a wet etch method, such as reaction ion etching. When the surface of the substrate 110 has the textured surface as described above, the amount of light incident on the substrate 110 is increased because an effect that the reflection of light incident on the substrate 110 is prevented is improved.

Figure 12C:
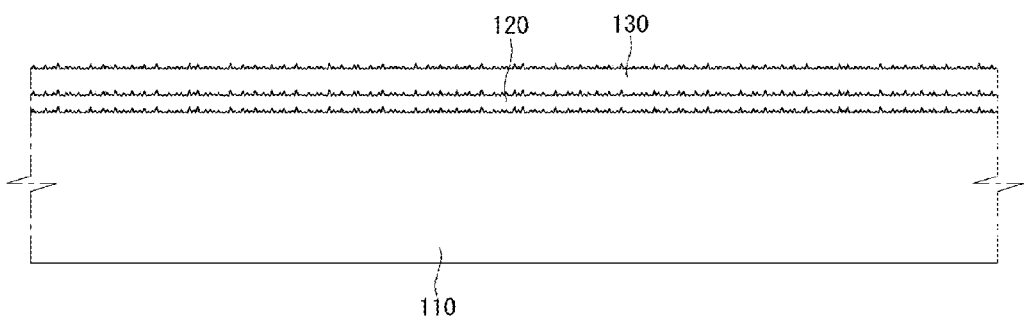

Next, as shown in FIG. 12c, the anti-reflection region 130 is formed over the emitter region 120 formed on the front surface side of the substrate 110 by using a Plasma Enhanced Chemical Vapor Deposition (PECVD) method. Here, the anti-reflection region 130 may be made of hydrogenated silicon nitrides (SiNx:H), hydrogenated silicon oxide nitrides (SiOxNy:H), hydrogenated silicon oxides (SiOx:H), or aluminum oxides ($Al_2O_3$).

Figure 12D:
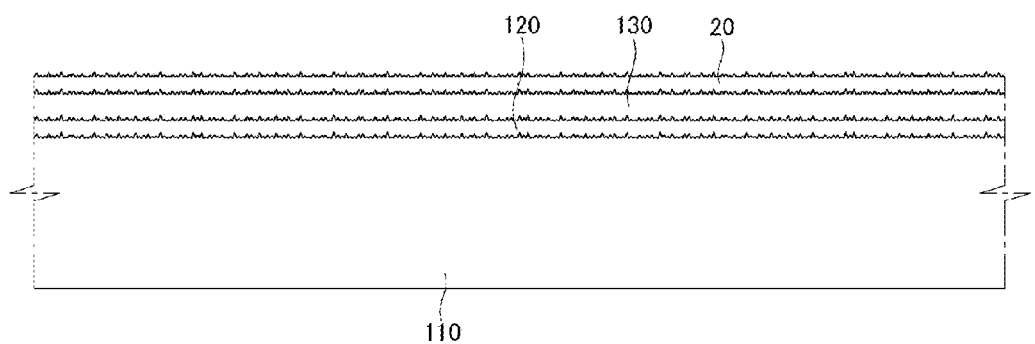

Next, as shown in FIG. 12d, an impurity film 20 including impurities of the second conductive type is formed over the anti-reflection region 130 by using an inject-printing method, a spin-coating method, or a screen-printing method.

Figure 12E:
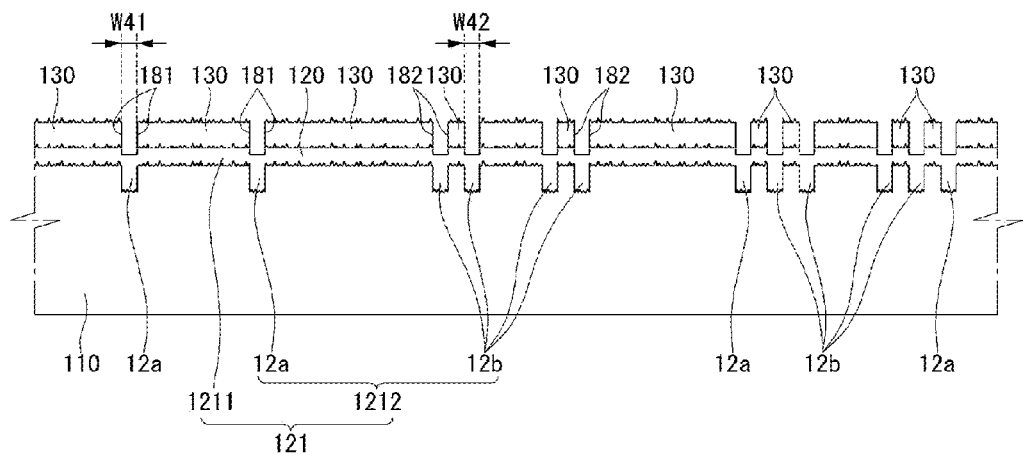

Next, as shown in FIG. 12e, the plurality of first and second opening regions 181 and 182 forming the emitter region 120 are formed in the anti-reflection region 130 by partially radiating a laser beam over the anti-reflection region 130.

The widths W41 and W42 of the first and the second opening regions 181 and 182 are identical with each other, and each of the widths W41 and W42 of the first and the second opening regions 181 and 182 may be about 5 μm to about 15 μm. The plurality of first opening regions 181 are the opening regions for forming the plurality of front electrodes 141 (i.e., the opening regions for the front electrodes), and the plurality of second opening regions 182 are the opening regions for forming the plurality of front bus bars 142 (i.e., the opening regions for the front bus bars).

Each of the first opening regions 181 is the opening region for forming each of the front electrodes 141. The first opening regions 181 are formed in the front electrode formation region AA where the front electrodes 141 will be formed in the anti-reflection region 130. The plurality of second opening regions 182 are the opening regions for forming the front bus bars 142. In order to form one front bus bar 142 having a width of about 1 mm to 1.5 mm as described above with reference to FIGS. 9 and 10, about 30 to 70 second opening regions 182 are formed in the front bus bar formation region AB of the anti-reflection region 130.

When the plurality of first and second opening regions 181 and 182 through which the emitter region 120 is exposed is formed over the anti-reflection region 130 by radiating the laser beam to the impurity film 20 as described above, the impurities of the second conductive type included in the impurity film 20 placed over the anti-reflection region 130 are further implanted and doped into the parts of the emitter region 120 exposed through the first and the second opening regions 181 and 182.

An object to radiate the laser beam is to form the plurality of first and second opening regions 181 and 182 at desired positions of the anti-reflection region 130 by removing desired parts of the anti-reflection region 130 and to further dope the impurities of the second conductive type into the desired parts of the emitter region 120.

Accordingly, the parts of the emitter region 120 exposed through the parts (i.e., the plurality of first and second opening regions 181 and 182) of the emitter region 120 to which the laser beam has been radiated have a higher impurity doping concentration than the remaining parts of the emitter region 120 to which the laser beam has not been radiated. Accordingly, the surface resistance value of the parts of the emitter region 120 is lower than the initial surface resistance value of the emitter region 120.

Accordingly, the parts of the emitter region 120 exposed through the plurality of first and second opening regions 181 and 182 have a surface resistance value (e.g., 10 Ω/sq. to 50 Ω/sq.) lower than the surface resistance value 80 Ω/sq. to 120 Ω/sq. of the emitter region 120.

After the operation of radiating the laser beam is finished, the emitter region 120 becomes the emitter region 121 of the selective emitter structure, including the first emitter parts 1211, placed under the anti-reflection region 130 and each formed to have a surface resistance value (i.e., a first surface resistance value) of about 80 Ω/sq. to 120 Ω/sq., and the second emitter parts 1212 placed in the parts of the emitter region 120 exposed through the plurality of first and second opening regions 181 and 182 and formed to have a surface resistance value (i.e., a second surface resistance value) of about 10 Ω/sq. to 50 Ω/sq.

The width W41 and W42 of the first and the second opening regions 181 and 182 may be the same as the widths W11 and W12 of the second emitter parts 1212, respectively, formed by the first and the second opening regions 181 and 182. The interval D11 between two adjacent second opening regions 182, from among the plurality of second opening regions 182 formed to form one front bus bar 142, may be the same as the interval D11 between two adjacent second emitter parts 1212 formed by the two adjacent second opening regions 182.

Next, the impurity film 20 remaining on the anti-reflection region 130 is removed by using hydrofluoric (HF) acid and pure water.

The plurality of first and second opening regions 181 and 182 formed in the anti-reflection region 130 by radiating the laser beam as described above is for contact between the emitter region 121 [i.e., the second emitter part 1212] and the plurality of front electrodes 141 and between the emitter region 121 and the plurality of front bus bars 142, when the plurality of front electrodes 141 and the plurality of front bus bars 142 are formed using the plating method.

As described above, a part of the anti-reflection region 130 where one front bus bar 142 will be placed is partially or selectively removed by using a laser beam in order to form each of the front bus bars 142, instead of fully removing the part of the anti-reflection region 130 where one front bus bar 142 will be formed by using a laser beam in order to form each of the front bus bars 142. Accordingly, the area of the anti-reflection region 130 to which the laser beam is radiated is reduced.

Accordingly, there are advantages in that the time taken to fabricate the solar cell 1 and a change in the characteristic of the solar cell 1 are reduced because the time taken to radiate a laser beam is reduced and a phenomenon in which the emitter region 121 or the substrate 110 are deteriorated by heat due to the laser beam is reduced.

Furthermore, the desired parts of the anti-reflection region 130 are removed by using a laser beam directly radiated to the anti-reflection region 130, instead of using an operation of removing the anti-reflection region 130 using etch paste or an additional mask. Accordingly, the width of each of the first and the second opening regions 181 and 182 that are formed is much smaller than that when the etch paste or the mask is used.

Accordingly, an area where the plurality of front electrodes 141 is formed is reduced because an area where the second emitter part 1212 (i.e., a high concentration impurity doping part) is formed is reduced and the width of the front electrode 141 is reduced.

In the present embodiment, the laser beam radiated to form the plurality of first and second opening regions 181 and 182 may have a wavelength of 532 nm, and power of the laser beam may be about 5 W to 20 W. Here, the power or the radiation time of the laser beam may be determined depending on a material or thickness of the anti-reflection region 130.

The side of each of the plurality of first opening regions 181 and each of the plurality of second opening regions 182, formed by radiating the laser beam as described above, may have a plane or a concave-convex surface (i.e., a non-plane).

When both sides of the second emitter parts 12a and 12b exposed through the first and the second opening regions 181 and 182 have the plane, a laser beam used may have a stripe form having the same width as each of the first and the second opening regions 181 and 182. When both sides of the second emitter parts 12a and 12b exposed through the first and the second opening regions 181 and 182 have the concave-convex surface, a laser beam used may have a spot form having the same width as each of the first and the second opening regions 181 and 182.

When both sides of the second emitter parts 12a and 12b exposed through the first and the second opening regions 181 and 182 have the concave-convex surface, the area of the second emitter parts 12a and 12b exposed through the first and the second opening regions 181 and 182 is increased. Accordingly, a contact area where the front electrode 141 comes in contact with the second emitter parts 12a and 12b and a contact area where the front bus bar 142 comes in contact with the second emitter parts 12a and 12b are increased. When the first and the second opening regions 181 and 182 are formed using the laser beam having the stripe form, the time taken to form the first and the second opening regions 181 and 182 is reduced.

Figure 12F:
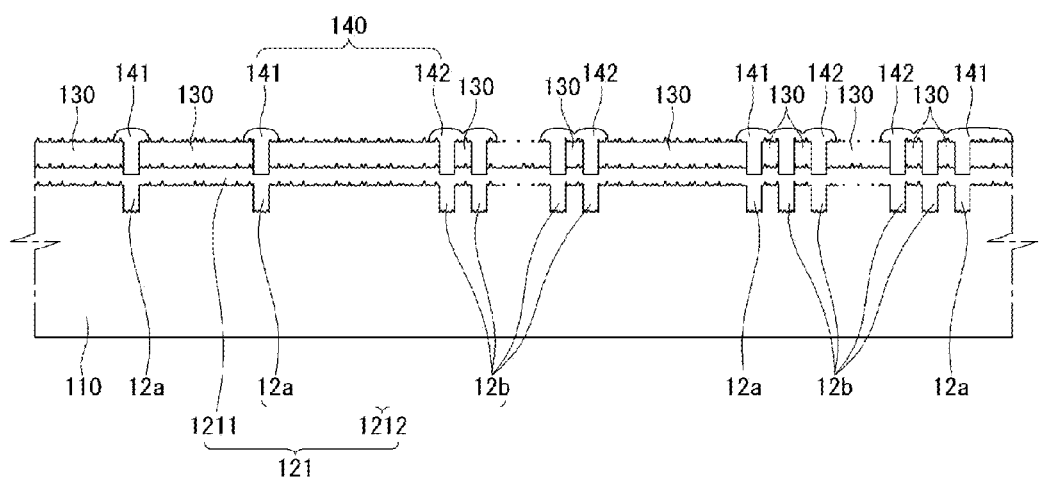

After the plurality of first and second opening regions 181 and 182 is formed in the anti-reflection region 130 in order to form the front electrode region 140 using a plating method as described above, the front electrode region 140 including the plurality of front electrodes 141 and the plurality of front bus bars 142 is formed by performing plating on the second emitter part 1212 exposed through the plurality of first and second opening regions 181 and 182, as shown in FIG. 12f. Here, an electroplating method or a Light-Induced Plating (LIP) method may be used as the plating method.

Accordingly, the plating is performed by precipitating a solution [e.g., $KAg(CN)_2$], containing relevant metal ions (e.g., silver (Ag) ions), into the second emitter parts 1212 of the emitter region 121 exposed through the plurality of first and second opening regions 181 and 182.

As already described above with reference to FIGS. 10(a) to 10(c), the top surface of each of the front electrodes 141 and the top surface of each of the front bus bars 142 have respective curved surface shapes according to a plating characteristic, and the plurality of opening regions 182 adjacent to one another is formed in order to form one front bus bar 142. Accordingly, metals (i.e., parts of the front bus bars 142) grown in the two second opening regions 182 adjacent to each other, respectively, from among the plurality of second opening regions 182 formed to form one front bus bar 142, meet each other over the anti-reflection region 130, thus forming one front bus bar 142.

Accordingly, the width of each of the front bus bars 142 that are finally formed [i.e., the width of the bottom surface of each of the front bus bars 142 coming in contact with the anti-reflection region 130 and the emitter part 1212] is greater than the width D21 of the front bus bar formation region AB.

As described above, since the metal plating growth is isotropic growth, a top surface [i.e., a surface of the front bus bar 142 placed on the opposite side to the bottom surface] of the metal (i.e., part of the front bus bar 142) plated on the basis of each of the second opening regions 182 also has a curved surface shape. Metal plating is performed on the basis of each of the two adjacent second opening regions 182 and is overlapped with the anti-reflection region 130 placed between the two adjacent second opening regions 182. Accordingly, the height of the top surface of the overlapping part of the metal grown by plating becomes higher than the height of the top surface of the metal part grown by plating on second emitter part 1212 exposed through the second opening region 182.

Accordingly, the top surface [i.e., the surface of the front bus bar 142 placed on the opposite side to the bottom surface] of each of the front bus bars 142, formed on the anti-reflection region 130 and on the second emitter part 1212 that are exposed through the second opening region 182 has a curved surface shape including the concave-convex surface having the plurality of convex parts and the plurality of concave parts.

Consequently, the surface roughness of the top surface of each of the front bus bars 142 is increased.

Each of the front electrodes 141 and each of the front bus bars 142, included in the front electrode region 140 formed by the plating method as described above, are illustrated to have a single film structure made of metal, such as silver (Ag), but, in an alternative example, they may have a multi-film structure, such as a dual film or a triple film.

When each of the front electrodes 141 and each of the front bus bars 142 have a dual film structure, a lower film coming in contact with the emitter region 121 may be made of nickel (Ni), and an upper film placed on the lower film may be made of silver (Ag). Furthermore, when each of the front electrodes 141 and each of the front bus bars 142 have a triple film structure, a lower film coming in contact with the emitter region 121 may be made of nickel (Ni), a middle film placed on the lower film may be made of copper (Cu), and an upper film placed on the middle film may be made of silver (Ag) or tin (Sn).

Here, the lower film of each of the front electrodes 141 and each of the front bus bars 142 functions to improve an adhesion characteristic by reducing specific contact resistivity with the second emitter part 1212 coming in contact with the lower film. The middle film of each of the front electrodes 141 and each of the front bus bars 142 is for reducing costs and may be made of material having a low cost and excellent conductivity, such as copper (Cu). When the middle film is made of copper (Cu), the lower film placed under the middle film functions to prevent copper (Cu), having excellent bonding strength with silicon (Si), from functioning as impurities that penetrate into (or are absorbed by) the second emitter part 1212 made of silicon (Si) and thus hinder the movement of electric charges.

Furthermore, the upper film functions to prevent a film, placed under the upper film (e.g., the lower film or the middle film), from being oxidized and improve adhesive strength with a conductive tape placed over the upper film.

When the front electrode region 140 has a multi-layered film as described above, a multi-layered film sequentially having a desired thickness from the lower film to the upper film is formed using the plating method.

The film structure and material of the plurality of front electrodes 141 and the plurality of front bus bars 142 are the because the plurality of front electrodes 141 and the plurality of front bus bars 142 are formed at the same time using a plating process.

Figure 12G:
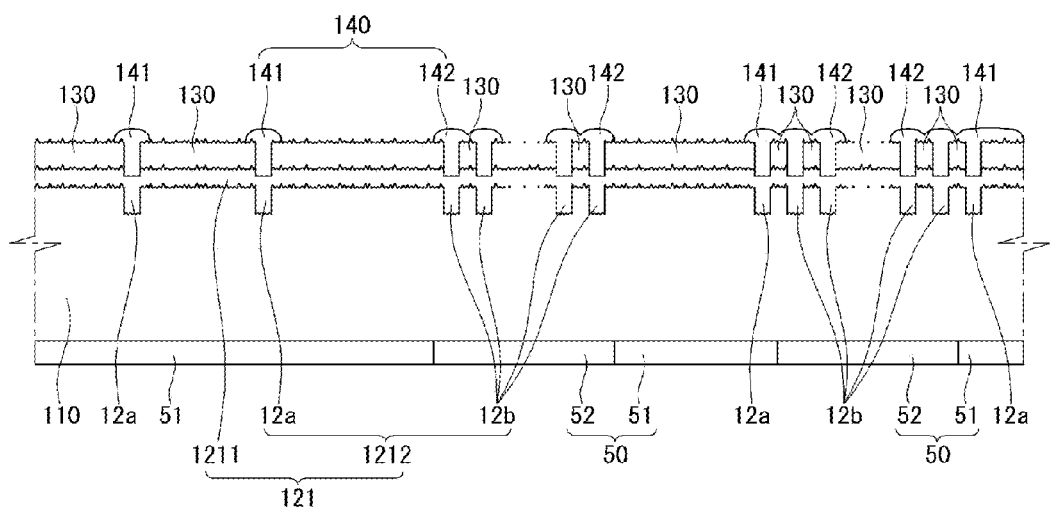

As shown in FIG. 12g, back bus bar patterns 52 are partially formed in the back surface of the substrate 110, corresponding to the front bus bars 142, by printing paste containing silver (Ag) using a screen-printing method and then drying the paste. Furthermore, back electrode patterns 51 partially placed in the back surface of the substrate 110 in which the back bus bar patterns 52 are not placed are formed by printing aluminum (Al), aluminum (Al)-silver (Ag), or paste containing silver (Ag) on the remaining back surface of the substrate 110 using a screen-printing method and then drying aluminum (Al), aluminum (Al)-silver (Ag), or the paste containing silver (Ag). Accordingly, back electrode region patterns 50 each including the back electrode pattern 51 and the back bus bar pattern 52 are completed.

Here, the back electrode pattern 51 is placed in part of an adjacent back bus bar pattern 52 and may be partially overlapped with the adjacent back bus bar pattern 52, but may not formed in the edge part of the back surface of the substrate 110.

When the substrate 110 is a p type, the back electrode patterns 51 may be made of paste containing aluminum (Al). When the substrate 110 is an n type, the back electrode patterns 51 may be made of paste containing aluminum (Al)-silver (Ag) or paste containing silver (Ag).

Here, the back electrode patterns 51 and the back bus bar pattern 52 may be dried in a temperature of about 120° C. to about 200° C. An order that the back electrode patterns 51 and the back bus bar pattern 52 are formed may be changed.

Next, the substrate 110 in which the back electrode region patterns 50 are formed is subjected to a thermal treatment process in a temperature of about 750° C. to about 800° C.

Accordingly, the back electrode region 150, including the back electrode 151 electrically connected to the substrate 110 and the plurality of back bus bars 152 connected to the substrate 110 and the back electrode 151, and the back surface field regions 172 placed in the back surface of the substrate 110 coming in contact with the back electrodes 151 are formed (see FIGS. 1 and 2).

In other words, the back electrode pattern 51 and the back bus bar pattern 52 of the back electrode region pattern 50 are chemically combined with the substrate 110 by means of the thermal treatment process. Thus, the back electrode pattern 51 and the back bus bar pattern 52 are formed into the back electrode 151 and the plurality of back bus bars 152, respectively. Here, the back electrode pattern 51 and the back bus bar pattern 52 adjacent to each other are chemically combined, so that the back electrode 151 and the back bus bars 152 are electrically coupled.

Furthermore, during the thermal treatment process, aluminum (Al) or silver (Ag) included in the back electrode pattern 51 of the back electrode region pattern 50 is diffused into the substrate 110, so that the back surface field region 172 (i.e., an impurity doping region) having a higher impurity concentration than the substrate 110 is formed in the substrate 110. Thus, the back electrode 151 is brought in contact with the back surface field region 172 having higher conductivity than the substrate 110 and is electrically connected to the substrate 110. Accordingly, electric charges from the substrate 110 are collected more easily.

In the present embodiment, since the emitter regions 121 are formed only in the front surface of the substrate 110, an edge isolation process for blocking electrical connection with the emitter region placed in the back surface of the substrate 110 or an additional process for removing emitter regions formed in the back surface of the substrate 110 are not required. Accordingly, the productivity of the solar cell 1 is improved and manufacturing costs are reduced because the time taken to fabricate the solar cell 1 is reduced.

In the present embodiment, an example in which the front electrode region 140 including the plurality of front electrodes 141 and the plurality of front bus bars 142 is formed and the back electrode region 150 including the back electrode 151 and the plurality of back bus bars 152 is then formed has been described. In an alternative example, the back electrode region 150 may be first formed, and the front electrode region 140 may be then formed.

As described above, since the plurality of front electrodes 141 is formed by plating, the width of each of the front electrodes 141 is smaller than the width of each of the front electrodes 141 when the plurality of front electrodes 141 is formed by using a screen-printing method. Accordingly, the area of the solar cell 1 on which light is incident is increased, and the efficiency of the solar cell 1 is improved.

Unlike in the present embodiment, when the emitter region 121 does not have the selective emitter structure (i.e., the emitter region 121 placed under the front electrode region 140 has the same surface resistance value as the emitter regions 121 other than the emitter regions 121 placed under the front electrode region 140 because the emitter regions 121 have the same surface resistance values irrespective of their positions), the process of FIG. 12*d* in the processes described above is omitted.

In this case, after the anti-reflection region 130 is formed on the emitter region 120 of the substrate 110, the plurality of first and second opening regions 181 and 182 is formed in the anti-reflection region 130 by directly radiating a laser beam over the anti-reflection region 130.

Furthermore, an additional impurity film capable of further implanting impurities of the second conductive type into the emitter region 120 does not exist over or under the anti-reflection region 130, and the object to radiate the laser beam is not for further doping the impurities of the second conductive type, but for removing only desired parts of the anti-reflection region 130. Accordingly, an additional impurity doping process is not performed on the parts of the emitter region 120 to which the laser beam has been radiated.

Accordingly, the parts of the emitter region 120 to which the laser beam has been radiated and the parts of the emitter region 120 to which the laser beam has not been radiated have the same impurity doping concentration and surface resistance value.

As described above, the object to radiate the laser beam is different from the object described with reference to FIG. 12*e*. Here, the radiated laser beam may have a wavelength of 355 nm. Furthermore, power (about 5 W to 20 W) of the laser beam or the time taken to radiate the laser beam is determined depending on the material or thickness of the anti-reflection region 130.

In this case, the time taken to manufacture the solar cell 1 and costs necessary to fabricate the solar cell 1 are reduced because the processes of forming and removing the impurity film 20 are omitted.

In the present embodiment, the back electrodes 151 are made of paste containing aluminum (Al) or silver (Ag) by using a screen-printing method, and the back bus bars 152 are also made of paste containing aluminum (Al) or silver (Ag) by using a screen-printing method.

In an alternative embodiment, the back electrodes 151 and the back bus bars 152 are also formed using a plating method like the front electrodes 141 and the front bus bars 142.

In this case, like the front electrode region 140, the back electrodes 151 and the back bus bars 152 may be formed at the same time using the same plating process, and thus the back electrodes 151 and the back bus bars 152 may be made of the same material.

In addition, the back electrodes 151 and the back bus bars 152 may be formed simultaneously with the front electrodes 141 and the front bus bars 142 by using the plating process for the front electrodes 141 and the front bus bars 142. In this case, the material of the back electrode region 150 is the same as that of the front electrode region 140. Furthermore, the back electrode region 150 may have not only a single film, but also a multi-film, such as a dual film or a triple film.

When the back electrode region 150 is formed by a plating method, the back electrode 151 and the back bus bar 152 have a dual film or a triple film. When a lower film is made of nickel (Ni), nickel silicide exists in the back surface field region 172 (i.e., between the part of the substrate 110 into which the impurities of the first conductive type have been doped at a high concentration and the back electrode 151 and between the substrate 110 and the back bus bar 152), and a component of glass frit is not detected between the back electrode 151 and the substrate 110 [or the back surface field region 172] and between the back bus bar 152 and the substrate 110 [or the back surface field region 172].

FIGS. 12a to 12g illustrate the method of fabricating the solar cell 1 shown in FIGS. 1 and 2. A method of forming the solar cell 1 shown in FIG. 11 is the same as the method described with reference to FIGS. 12a to 12g other than the number of second opening regions 182 for forming the front bus bar 142 and the width of the front bus bar 142.

In other words, in the solar cell 1 shown in FIG. 11, one second opening region 182 is necessary for one front bus bar 142. Thus, the number of second opening regions 182 and the width of each of the second opening regions 182 have only to be changed in the process of forming the first and the second opening regions 181 and 182 shown in FIG. 12e. Accordingly, the method of manufacturing the solar cell 1 shown in FIG. 11 is omitted.

A solar cell module fabricated by electrically connecting a plurality of the solar cells 1 using interconnectors is described below with reference to FIG. 13.

The solar cell module 100 includes a plurality of solar cells 1 electrically connected by a plurality of interconnectors 210, a passivation film 220 configured to protect the plurality of solar cells 1, a transparent member 230 placed on the passivation film 220 placed on the light-receiving surface side of the plurality of solar cells 1, and a back sheet 240 placed under a passivation film 220 placed on the opposite side to the light-receiving surface.

The solar cell module 100 may further include a frame for receiving the elements 210 to 240 integrated by a lamination process and a junction box for collecting power generated from the plurality of solar cells 1.

The back sheet 240 functions to prevent moisture from being infiltrated from the back surface of the solar cell module 100 and thus to protect the plurality of solar cells 1 from an external environment. The back sheet 240 may have a multi-layer structure, including a layer for preventing the infiltration of moisture and oxygen, a layer for preventing chemical corrosion, and a layer having an insulating characteristic. The back sheet 240 may be made of opaque material.

The passivation films 220 are disposed under and on the plurality of solar cells 1 arranged in a matrix form, respectively, and are integrated with the plurality of solar cells 1 by a lamination process in such a way to surround the plurality of solar cells 1. The passivation films 220 functions to prevent corrosion due to the infiltration of external moisture and to protect the plurality of solar cells 1 from shock. The passivation film 220 may be made of material, such as Ethylene Vinyl Acetate (EVA).

The transparent member 230 placed over the passivation film 220 is made of tempered glass having high transmittance and an excellent anti-breakage function. The tempered glass may be low iron tempered glass having low iron component. The inside of the transparent member 230 may be subject to embossing processing in order to increase the scattering effect of light.

The electrical connection structure of the plurality of solar cells 1 included in the solar cell module 100 according to the present invention is described in detail with reference to FIGS. 14 and 15.

Figure 13:
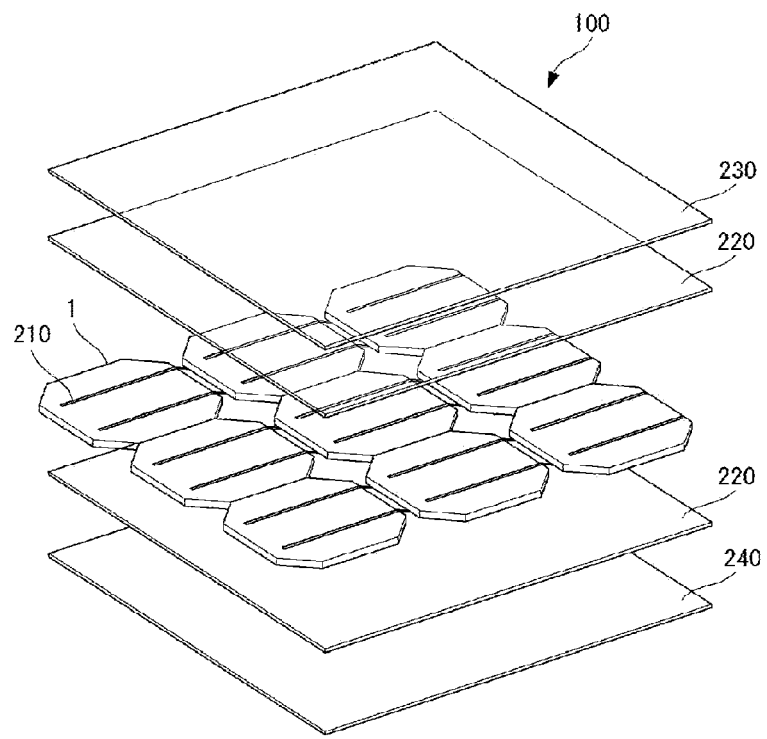
FIG. 13 is a plan view of a solar cell module according to an embodiment of the present invention.
Figure 14:
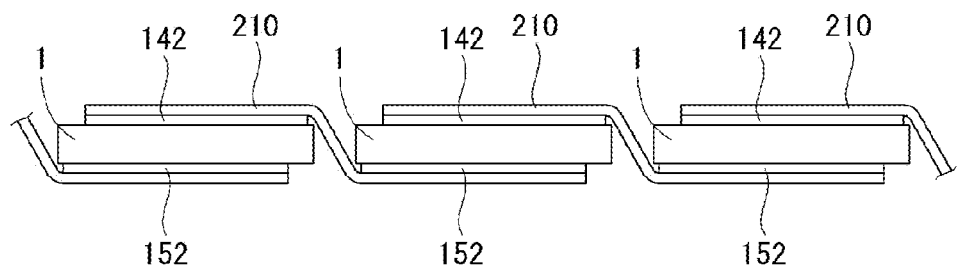
FIG. 14 is a schematic lateral view showing an example in which adjacent solar cells in FIG. 13 are coupled in series by an interconnector.

The plurality of solar cells 1 included in the solar cell module 100 is arranged in a matrix form and coupled by the plurality of interconnectors 210 as shown in FIGS. 13 and 14.

Figure 15:
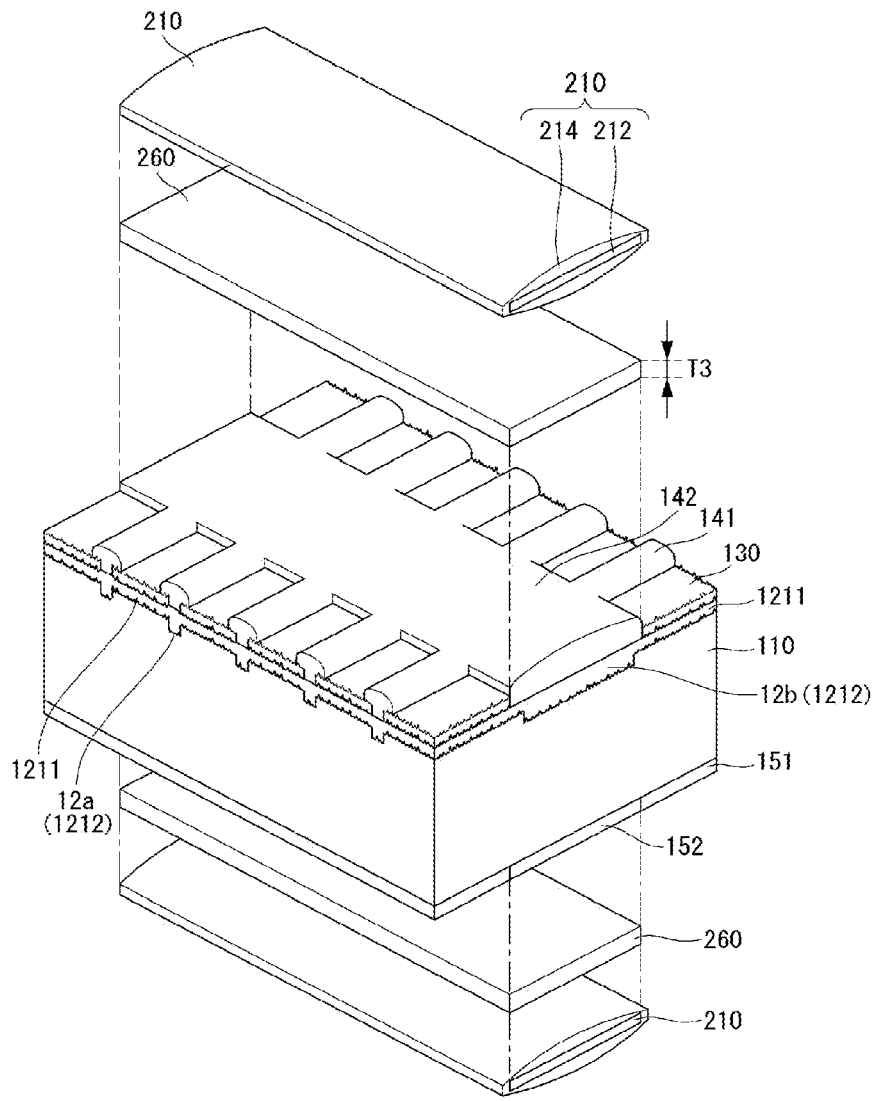
FIG. 15 is a schematic exploded perspective view of the solar cell module according to an embodiment of the present invention.

As shown in FIG. 15, each of the interconnectors 210 includes conductive metal (e.g., copper (Cu)) 212 of unleaded material, containing a lead component of 1,000 ppm or lower, and solder (e.g., SnPbAg) 214 of leaded material that is coated on a surface of the conductive metal 212. The material that coats the conductive metal 212 may be conductive metal (e.g., SnAg) not containing lead (Pb) and the interconnector 210 may be made of only the conductive metal 212, according to circumstances.

As shown in FIG. 15, each of the top surface and the bottom surface of the interconnector 210 has a curved surface not a plane. Accordingly, in the bottom surface of the interconnector 210 electrically connected to the front bus bar 142, the central part of the interconnector 210 and the peripheral parts of the interconnector 210 are not placed in the same height, but they have a difference H41 in height (e.g., FIG. 20).

In two adjacent solar cells 1 placed in the same row, from among the plurality of solar cells 1 arranged in a matrix form, the front bus bars 142 placed in one of the two solar cells 1 are electrically and physically connected to the respective back bus bars 152, placed in the other of the two solar cells 1, through the interconnector 210. Furthermore, in two adjacent solar cells 1 placed in the same column, from among the plurality of solar cells 1 arranged in a matrix form, the front bus bars 142 placed in one of the two solar cells 1 and not connected to the other of the two solar cells 1 are electrically and physically connected to the respective back bus bars 152, placed in the other of the two solar cells 1 and not connected to the one of the two solar cells 1, through the interconnector 210.

A connection structure between the front bus bar 142 and the back bus bar 152 of the solar cell 1 using the plurality of interconnectors 210 as described above is described in detail below.

As described above, in the present embodiment, the front bus bar 142 and the back bus bar 152 are not directly connected to the respective interconnectors 210, but are physically and electrically connected to the respective interconnectors 210 with respective conductive adhesion films 260 interposed therebetween.

As shown in FIG. 15, the conductive adhesion films 260 and the interconnectors 210 are sequentially placed on the front bus bar 142 and the back bus bar 152, respectively, and the conductive adhesion film 260 and the interconnector 210 are extended in a direction where the front bus bar 142 and the back bus bar 152 are extended.

In FIG. 15, one front bus bar 142 and one back bus bar 152 are placed in the front surface and the back surface of the substrate 110, respectively, and thus the number of each of the conductive adhesion films 260 and the interconnectors 210 placed in the front surface and the back surface of the substrate 110, respectively, is one. The conductive adhesion film 260 and the interconnector 210 are placed in each of the plurality of front bus bars 142 placed in the front surface of the substrate 110, and the conductive adhesion film 260 and the interconnector 210 are placed in each of the plurality of back bus bars 152 placed in the back surface of the substrate 110. Accordingly, the number of front bus bars 142 placed in the front surface of the substrate 110 is the same as the number of each of the conductive adhesion films 260 and the interconnectors 210 placed over the front bus bars 142. The number of back bus bars 152 placed in the back surface of the substrate 110 is the same as the number of each of the conductive adhesion films 260 and the interconnectors 210 placed over the back bus bars 152.

As shown in FIGS. 16 to 19, the conductive adhesion film 260 includes resin 262 and a plurality of conductive particles 264 dispersed in the resin 262. The resin 262 may be made of any material having an adhesive property. It is preferred that thermosetting resin be used as the resin 262 in order to increase adhesion reliability. Only an example in which one front bus bar 142 and one interconnector 210 are coupled by the conductive adhesion film 260 is shown In FIGS. 16 to 19, for convenience of description. However, one back bus bar 152 and one interconnector 210 are coupled by the conductive adhesion film 260 as in FIGS. 16 to 19.

At least one kind selected from epoxy resin, phenoxy resin, acryl resin, polyimide resin, and polycarbonate resin may be used as the thermosetting resin.

The resin 262 may include a known hardener and a known hardening accelerator as specific ingredients other than the thermosetting resin. For example, the resin 262 may include reformed materials, such as a coupling agent based on silane, a coupling agent based on titanate, and a coupling agent based on aluminate, in order to improve an adhesive property between the front bus bar 142 and the interconnector 210 and between the back bus bar 152 and the interconnector 210. The resin 262 may further include a dispersing agent, such as calcium phosphate or calcium carbonate, in order to improve the dispersion property of the first conductive particle 264. The resin 262 may further include a rubber ingredient, such as acrylic rubber, silicon rubber, or urethane, in order to control the modulus of elasticity.

As shown in FIGS. 16 to 19, the conductive particles 264 include a plurality of first conductive particles 2641 each having a first thickness T1 and a plurality of conductive particles 2642 each having a second thickness T2 smaller than the first thickness T1. The plurality of first conductive particles 2641 and the plurality of second conductive particles 2642 are dispersed in the resin 262.

Figure 16:
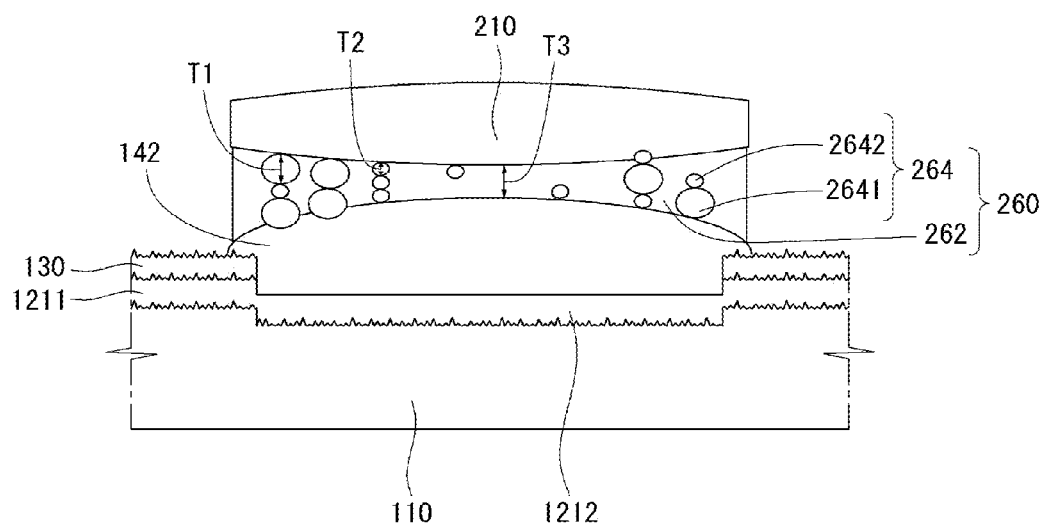
FIGS. 16 to 19 are cross-sectional views showing various examples in each of which the front bus bar and the interconnector are coupled using a conductive adhesion film in FIG. 13.

As shown in FIG. 16, the first thickness T1 of each of the plurality of first conductive particles 2641 may be smaller than a thickness T3 of the conductive adhesion film 260.

Figure 17:
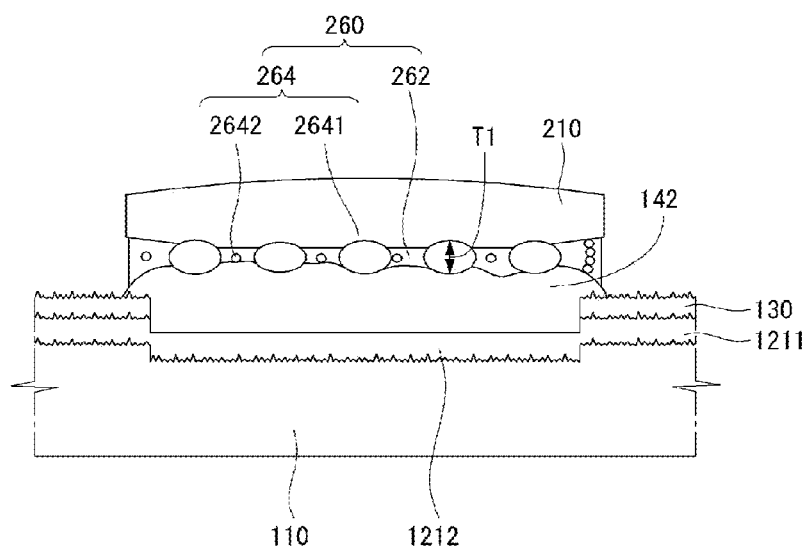
Figure 18:
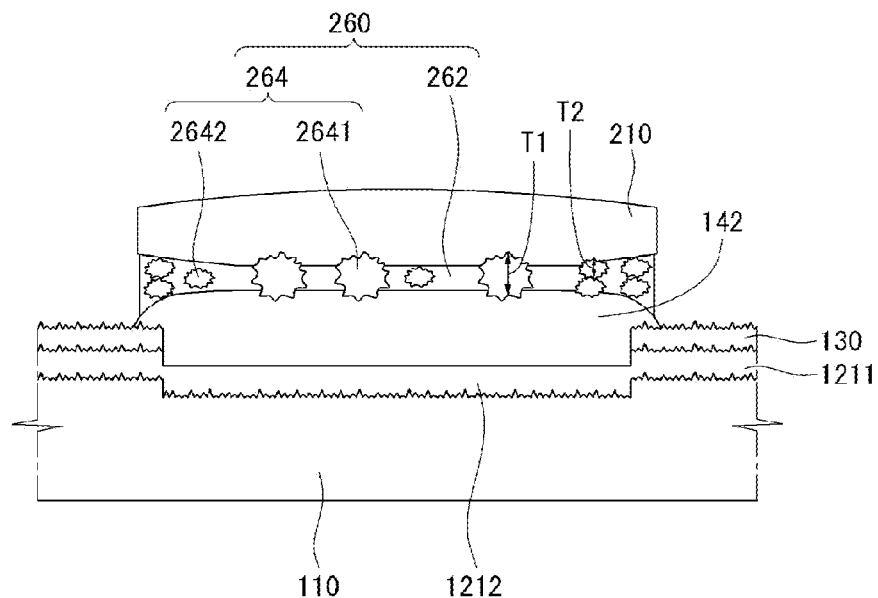
Figure 19:
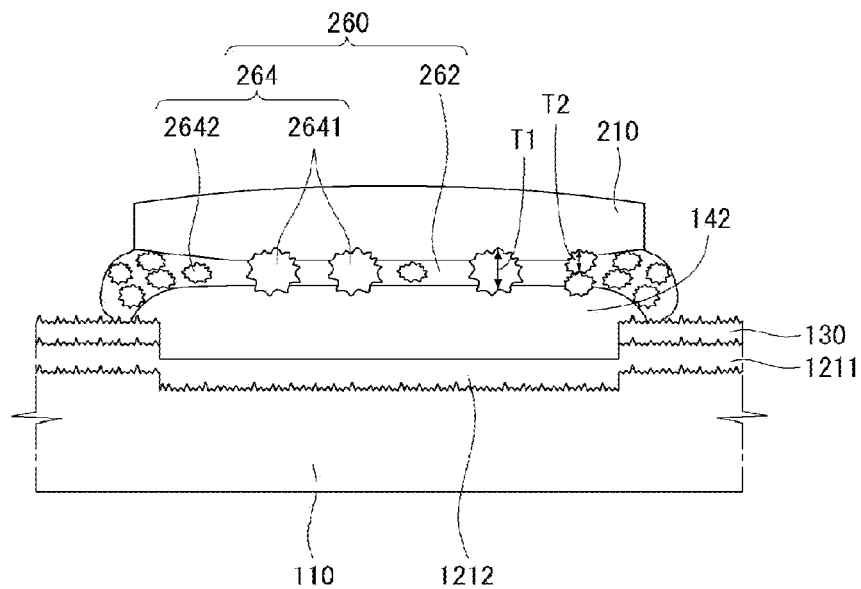

However, as shown in FIGS. 17 to 19, the first thickness T1 of each of the plurality of first conductive particles 2641 may be greater than the thickness T3 of the conductive adhesion film 260. In this case, at least part of each of the first conductive particles 2641 is protruded over the conductive adhesion film 260. In this case, the thickness T3 of the conductive adhesion film 260 is the same as the thickness of the resin 262.

In an alternative embodiment, in case of FIG. 16, the conductive particles 264 may include only one of the plurality of first conductive particles 2641 and the plurality of second conductive particles 2642. In case of FIGS. 17 to 19, the conductive particles 264 may include only the plurality of first conductive particles 2641.

When the conductive adhesion film 260 includes the first conductive particles 2641 each having a thickness greater than the thickness T3 of the conductive adhesion film 260, the front bus bar 142 and the interconnector 210 are electrically and physically connected by only one first conductive particle 2641 because the thickness T1 of the first conductive particle 2641 is greater than the thickness T3 of the conductive adhesion film 260. Accordingly, electric charges collected by the front bus bar 142 are transferred to the interconnector 210 more excellently and stably.

In the plurality of first conductive particles 2641 and the plurality of second conductive particles 2642, each having a thickness smaller than the thickness T1 of the first conductive particle 2641 or the thickness T3 of the conductive adhesion film 260, as shown in FIGS. 16 and 19, at least two second conductive particles 2642 overlap with each other in up and down directions between the front bus bar 142 and the interconnector 210, thus forming a physical connection path between the front bus bar 142 and the interconnector 210. Accordingly, the at least two second conductive particles 2642 transfer electric charges, collected by the front bus bar 142, to the interconnector 210 through a connection path formed by the plurality of second conductive particles 2642, or the electric charges jump between the first and the second conductive particles 2641 and 2642 and move from the front bus bar 142 to the interconnector 210.

Accordingly, the electric charges placed in the front bus bar 142 move to the first and the second conductive particles 2641 and 2642 coming in contact with the front bus bar 142 or jump to adjacent first and second conductive particles 2641 and 2642 not directly coming in contact with the front bus bar 142, and the jump to adjacent first and second conductive particles 2641 and 2642 once or more, so that the electric charges move from the front bus bar 142 to the interconnector 210.

In the present embodiment, each of the thickness T1 of the first conductive particle 2641 and the thickness T2 of the second conductive particle 2642 may be about 2 μm to about 30 μm.

Each of the first conductive particle 2641 and the second conductive particle 2642 may be formed of a metal-coated resin particle, including at least one kind metal, selected from copper (Cu), silver (Ag), gold (Au), iron (Fe), nickel (Ni), lead (Pb), zinc (Zn), cobalt (Co), titanium (Ti), and magnesium (Mg), as a principle ingredient or may be formed of a metal particle including the above metal as a principle ingredient.

Each of the first and the second conductive particles 2641 and 2642 may have a circle or an oval shape as shown in FIGS. 16 and 17 or may have a radial shape as shown in FIGS. 18 and 19.

The term 'radial shape' refers to a shape of a metal particle in which a plurality of protrusion is irregularly formed on a surface of the metal particle having an approximately global shape.

When each of the first and the second conductive particles 2641 and 2642 has a circle or an oval shape, each of the thicknesses T1 and T2 of the first and the second conductive particles 2641 and 2642 may be the diameter (i.e., a minimum diameter in case of an oval) of each of the first and the second conductive particle 2641 and 2642.

When each of the first and the second conductive particles 2641 and 2642 is formed of a metal particle having a radial shape, each of the thicknesses T1 and T2 of the first and the second conductive particles 2641 and 2642 may be the shortest diameter measured from an approximately global shape formed by a virtual line that connects the ends of the plurality of protrusions formed in the surface of the metal particle.

The first and the second conductive particles 2641 and 2642, each made of a metal particle having a radial shape, have lower specific contact resistivity than the first and the second conductive particles 2641 and 2642, each having a circle or an oval shape, because a contact area where the first and the second conductive particles 2641 and 2642 come in contact with at least one of the front bus bar 142 and the interconnector 210 is increased.

In order to maintain stable connection strength and adhesive strength between front bus bar 142 and the interconnector 210 after the resin 262 is hardened, a mixing amount of the conductive particle 264 dispersed in the resin 262 may be 0.5 wt % to 20 wt % of a total volume of the conductive adhesion film 260.

When the mixing amount of the conductive particle 264 is 0.5 wt % or higher, the movement of electric charges from the front bus bar 142 is performed more stably. When the mixing amount of the conductive particle 264 is 20 wt % or less, connection and adhesion with the front bus bar 142 are stably performed.

When the conductive adhesion film 260 is used for electrical connection between the front bus bar 142 and the interconnector 210 as described above, a tabbing process for attaching the conductive adhesion film 260 and the interconnector 210 over the front bus bar 142 includes a pre-bonding step (i.e., a first bonding step) of bonding the conductive adhesion film 260 to the front bus bar 142 of the solar cell 1 and a final bonding step (i.e., a second bonding step) of bonding the interconnector 210 and the conductive adhesion film 260.

The pre-bonding step is performed to stably place the conductive adhesion film 260 on the front bus bar 142. The final bonding step is performed to stably bond the conductive adhesion film 260 to the interconnector 210 placed over the front bus bar 142 so that the front bus bar 142 and the conductive adhesion film 260 and the front bus bar 142 and the interconnector 210 are stably coupled electrically and physically. Accordingly, a process temperature (i.e., heating temperature) and pressure applied to the top of the conductive adhesion film 260 in the pre-bonding step are lower than a process temperature and pressure applied to the top of the interconnector 210 in the final bonding step, respectively.

For example, in the pre-bonding step, the heating temperature may be about 100° C. or lower, the pressure may be about 1 MPa. Furthermore, in the final bonding step, the heating temperature may be about 140° C. to 180° C., and the pressure may be about 2 MPa to 3 MPa.

Accordingly, the front bus bar 142 and the interconnector 210 are stably closely adhered to the conductive adhesion film 260 therebetween and are thus normally connected to the conductive adhesion film 260. The back bus bar 152 and the interconnector 210 are also stably closely adhered to the conductive adhesion film 260 therebetween and are thus normally connected to the conductive adhesion film 260.

Furthermore, the time for heating and pressurization in the pre-bonding step may be set approximately within 5 seconds. The time for heating and pressurization in the final bonding step may be set approximately within 10 seconds. In this case, the front bus bar 142, the conductive adhesion film 260, and the interconnector 210 are not damaged or deformed by heat.

When the front bus bar 142 and the interconnector 210 are coupled by the conductive adhesion film 260 as described above, the resin 262 of the conductive adhesion film 260 may be softened or melted by heat and pressure applied in the pre-bonding step and the final bonding step. In this case, at least part of at least one of the first and the second conductive particles 2641 and 2642 included in the resin 262 enters at least one of the interconnector 201 and the front bus bar 142.

Accordingly, in the state in which the front bus bar 142 has been bonded to the interconnector 210 by the conductive adhesion film 260, each of a contact surface where the conductive particle 264 comes in contact with the interconnector 210 and a contact surface where the conductive particle 264 comes in contact with the front bus bar 142 becomes a non-plane, i.e., not a plane.

That is, as shown in FIGS. 16 to 19, the conductive particle 264 is embedded in the interconnector 210 and the front bus bar 142, and thus each of the interconnector 210 and the front bus bar 142 in which the conductive particle 264 has been embedded has the same surface shape as the conductive particle 264.

When the interconnector 210 includes the conductive metal 212 and the solder 214, at least some of the conductive particles 264 may be embedded up to the solder 214 of the interconnector 210 or may be embedded up to the conductive metal 212 via the solder 214.

Here, the conductive particles 264 may be embedded in the interconnector 210 while being deformed into an oval by pressure applied when a tabbing task is performed as shown in FIG. 17 or may be embedded in the interconnector 210 in the state in which the conductive particle 264 maintains a circle as shown in FIG. 16. The shapes of the conductive particles 2641 and 2642 may be changed when pressure is applied according to a difference between at least one of hardness and strength of the conductive particles 2641 and 2642 and at least one of hardness and strength of the interconnector 210.

The conductive adhesion film 260, the interconnector 210, and the front bus bar 142 may be formed to have the same line width or may be made to have the same line width after the tabbing process is finished as shown in FIGS. 16 to 18 by controlling pressure during the tabbing process.

In an alternative embodiment, the conductive adhesion film 260 may be formed to have a greater line width than each of the interconnector 210 and the front bus bar 142, or the conductive adhesion film 260 may be made to have a greater width than the front bus bar 142 after the tabbing process is finished as shown in FIG. 19 by controlling pressure applied during the tabbing process. Accordingly, the conductive adhesion film 260 covers both sides of the front bus bar 142, and the conductive adhesion film 260 is placed at the ends of both sides of the front bus bar 142 and also on the adjacent anti-reflection region 130 according to circumstances. In this case, the front bus bar 142 and the interconnector 210 are bonded together more stably because a contact area with the conductive adhesion film 260 is increased, thereby increasing adhesive strength with the conductive adhesion film 260.

Although not shown, in an alternative embodiment, the interconnector 210 and the front bus bar 142 may be formed to have a greater line width than the conductive adhesion film 260.

When the front bus bar 142 and the interconnector 210 are connected using the conductive adhesion film 260 as described above, the front bus bar 142 and the interconnector 210 are more stably bonded without damaging or breaking the interconnector 210.

In the present embodiment, the front electrode 141 and the front bus bar 142 have a curved surface shape, i.e., not a plane because the front electrode 141 and the front bus bar 142 are formed by plating. Accordingly, the height of a part in the central portion of each of the front electrodes 141 and each of the front bus bars 142 is higher than the height in the edge part of each of the front electrodes 141 and each of the front bus bar 142.

Accordingly, as described above, each of the top surface and the bottom surface of the interconnector 210 electrically coming in contact with the front bus bar 142 also has a curved surface, i.e., not a plane.

Accordingly, in a comparison example in which the interconnector 210 is attached right on the front bus bar 142 without using the conductive adhesion film 260, the front bus bar 142 and the interconnector 260 are difficult to be bonded together because the top surface of the front bus bar 142 has a curved surface shape and the top surface and the bottom surface of the interconnector 260 have curved surface shapes.

In other words, in the case in which each of a surface (i.e., the top surface) of the front bus bar 142, bonded to the interconnector 210, and a surface (i.e., the bottom surface) of the interconnector 210, bonded to the front bus bar 142, has a curved surface shape, when one of the top surface of the front bus bar 142 and the bottom surface of the interconnector 210 has a concave curved surface and the other of the top surface of the front bus bar 142 and the bottom surface of the interconnector 210 has a convex curved surface and vice versa, bonding can be easily performed.

Figure 20A:
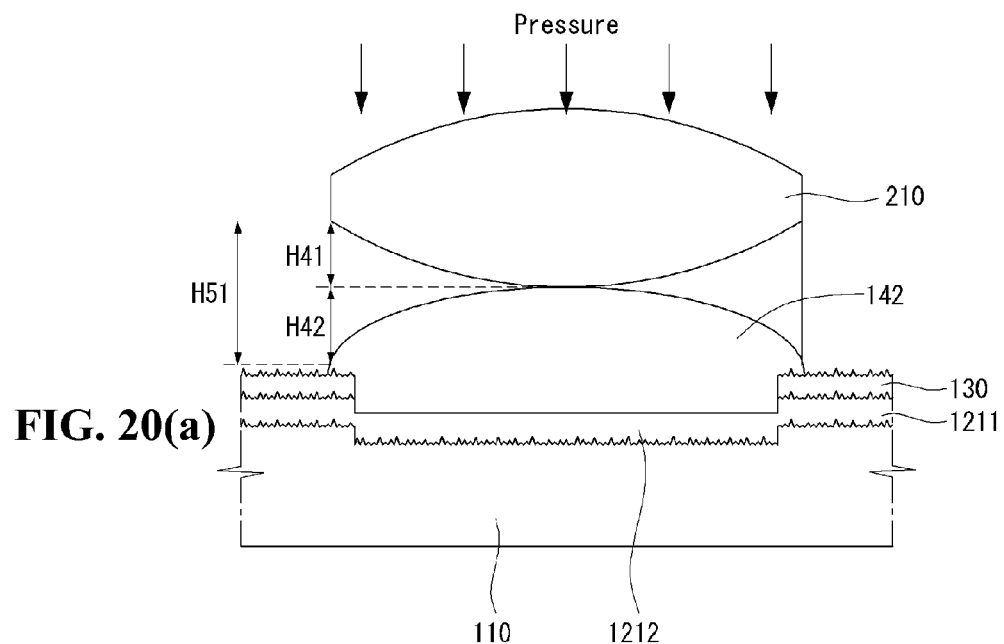
FIGS. 20(*a*) and 20(*b*) are cross-sectional views showing states in each of which the front bus bar and the interconnector are coupled according to a comparison example.

When the front bus bar 142 and the interconnector 210 are directly bonded together because both the top surface of the front bus bar 142 and the bottom surface of the interconnector 210 have convex curved surfaces as shown in FIG. 20(a), however, the central parts of the front bus bar 142 and the interconnector 210 come in contact with each other, but the peripheral parts of the front bus bar 142 and the interconnector 210 are spaced apart from each other by a specific interval H51 without coming in contact with each other.

The interval H51 between the front bus bar 142 and the interconnector 210 may be the sum of a difference H41 between the heights of a central part of the interconnector 210 and a peripheral part of the interconnector 210 and a difference H42 between the heights of a central part of the front bus bar 142 and a peripheral part of the front bus bar 142.

Accordingly, when the interconnector 210 is bonded right on the front bus bar 142 by a soldering method using flux in the comparison example, the interconnector 210 is attached right on the front bus bar 142 by applying pressure to the interconnector 210 in a temperature of about 220° C. to 260° C.

Figure 20B:
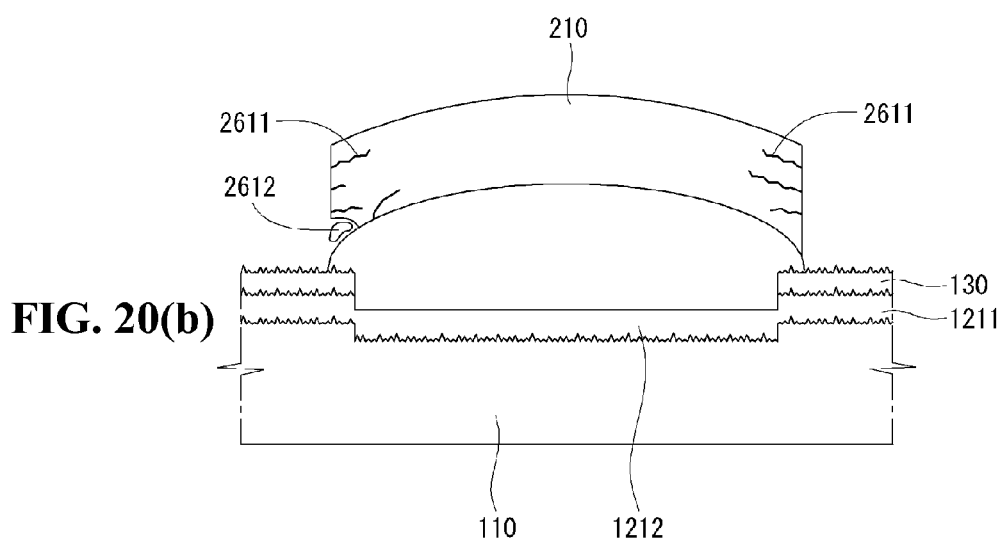

Since the front bus bar 142 and the interconnector 210 are spaced apart from each other by the interval H51 and the interconnector 210 is made of conductive metal that is less sensitive to heat than resin, cracks 2611 are generated in part of the interconnector 210 owing to applied pressure or defects 2612, such as that part of the interconnector 210 is fallen apart, are generated [FIG. 20(b)]. Furthermore, in FIG. 20(a), conductivity and a bonding area between the front bus bar 142 and the interconnector 210 are reduced because parts where the interconnector 210 and the front bus bar 142 are not stably bonded together occur owing to the interval H51 between the front bus bar 142 and the interconnector 210.

In addition, when applied pressure or heating temperature is increased in order to bond the peripheral parts of the interconnector 210 and the peripheral parts of the front bus bar 142 that are spaced apart from each other by the interval H51 and are facing each other, there is a problem in that cracks are generated in parts already bonded together (e.g., the central part of the front bus bar 142 and the central part of the interconnector 210) or the parts are damaged owing to excessive pressure, excessive temperature, etc. In some cases, at least one of the front bus bar 142, the interconnector 210, and the emitter region 121 may be deteriorated by heat.

In the present embodiment, however, as described above, the front bus bar 142 and the interconnector 210 are bonded together by using the conductive adhesion film 260 containing resin that is more sensitive to heat than conductive metal.

In this case, the resin 262 of the conductive adhesion film 260 is softened by heat applied in the pre-bonding step and the final bonding step, and the softened resin 262 has flexibility and a molding property much greater than the conductive metal.

Accordingly, when the conductive adhesion film 260 is closely adhered to the top surface of the front bus bar 142 and the bottom surface of the interconnector 210 by applied pressure, the softened resin 262 is smoothly molded along the surface shape of the top surface of the front bus bar 142 and the bottom surface of the interconnector 210, both having the convex curved surfaces. Thus, the top surface of the front bus bar 142 and the bottom surface of the interconnector 210, both having the curved surface shapes, and the conductive adhesion film 260 are stably bonded together.

Accordingly, since the flexibility and molding property of the resin 262 are increased by the softening phenomenon of the resin 262 as described above, adhesive strength between the conductive adhesion film 260 and the front bus bar 142 and a contact area where the conductive adhesion film 260 comes in contact with the front bus bar 142 and adhesive strength between the conductive adhesion film 260 and the interconnector 210 and a contact area where the conductive adhesion film 260 comes in contact with the interconnector 210 are increased. Furthermore, the occurrence of cracks in the interconnector 210 having a smaller flexibility and molding property than resin or a danger of breakage or damage to the interconnector 210 are significantly reduced or prevented.

Furthermore, when the front bus bar 142 and the interconnector 210 are bonded together using the conductive adhesion film 260 containing the resin 262, the tabbing process using the conductive adhesion film 260 is performed in a temperature of about 100° C. to 180° C. as described above because the resin 262 has a much lower melting point than the conductive metal 212 or the solder 214. When the interconnector 210 and the front bus bar 142 are directly bonded together as in the comparison example, however, the tabbing process is performed in a temperature of about 220° C. to 260° C.

Accordingly, a phenomenon in which the front bus bar 142, the interconnector 210, and the emitter region 121 are deteriorated is prevented because the process temperature of the present embodiment is much lower than that of the comparison example.

When the plurality of second opening regions 182 is used in order to form one front bus bar 142 as described above, the top surface of the front bus bar 142 coming in contact with the bottom surface of the conductive adhesion film 260 also has a curved surface shape. However, the roughness and flatness of the top surface of the front bus bar 142 are increased as compared with another embodiment in which one front bus bar 142 is formed using one second opening region 182 as described above. Accordingly, adhesive strength between the conductive adhesion film 260 and the front bus bar 142 is improved because the contact area where the front bus bar 142 comes in contact with the conductive adhesion film 260 is increased, as compared with another embodiment in which one front bus bar 142 is formed using one second opening region 182. Furthermore, the conductive adhesion film 260 and the front bus bar 142 are bonded together more stably and easily because of the increase in the flatness.

Although the connection structures between the front bus bar 142, the conductive adhesion film 260, and the interconnector 210 have been described above, the above description may also be likewise applied to connection structures between the back bus bars 152, the conductive adhesion film 260, and the interconnector 210.

In the above description, a difference between numerical values (e.g., thicknesses and depths) due to a difference in the height between the plurality of convex parts 11 formed in the substrate 110 and the plurality of convex parts 21 formed in the anti-reflection region 130 may be disregarded, and different numerical values within the difference in the height may be assumed to be the same.

In the embodiments of the present invention, an example in which the plurality of front electrodes 141 and the plurality of front bus bars 142 are formed to penetrate the anti-reflection region 130 through the plurality of first and second opening regions 181 and 183 and are connected to the emitter region 121 has been described. In an alternative embodiment of a solar cell 1a shown in FIGS. 21 to 23, a plurality of front electrodes 141 is connected to an emitter region 121 through an anti-reflection region 130, and a plurality of front bus bars 142a is placed on the anti-reflection region 130. Here, a part of each of the front bus bars 142a is placed in a part to cross each of the front electrodes 141 is connected to the emitter region 121.

Figure 21:
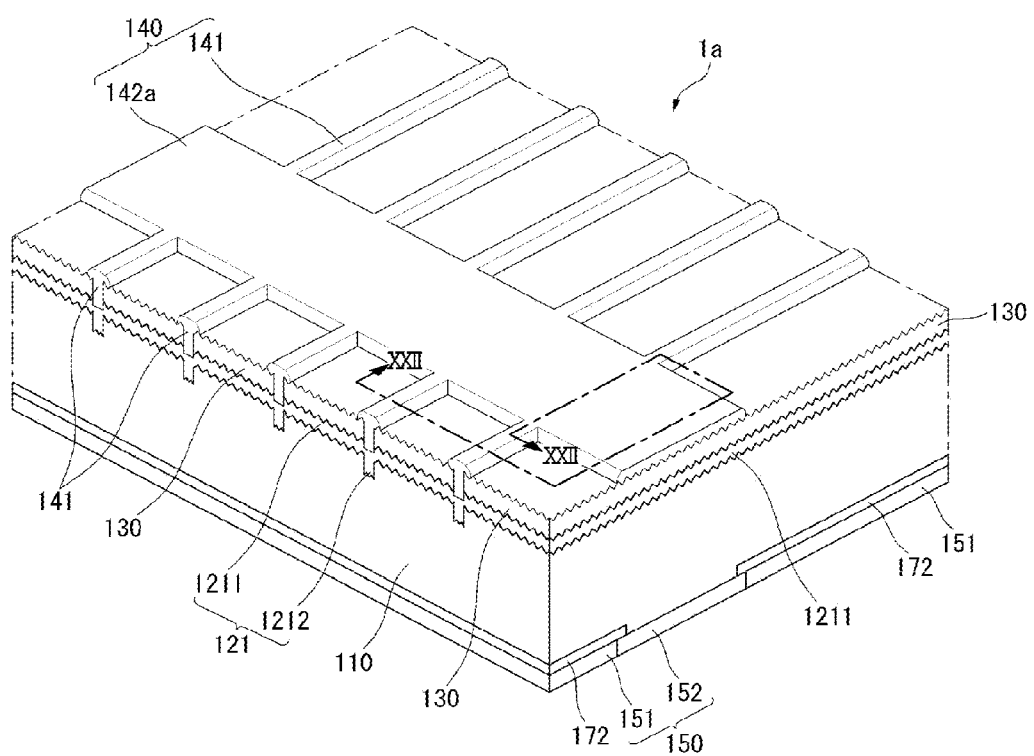
FIG. 21 is a partial perspective view of yet another example of a solar cell according to an embodiment of the present invention.
Figure 22:
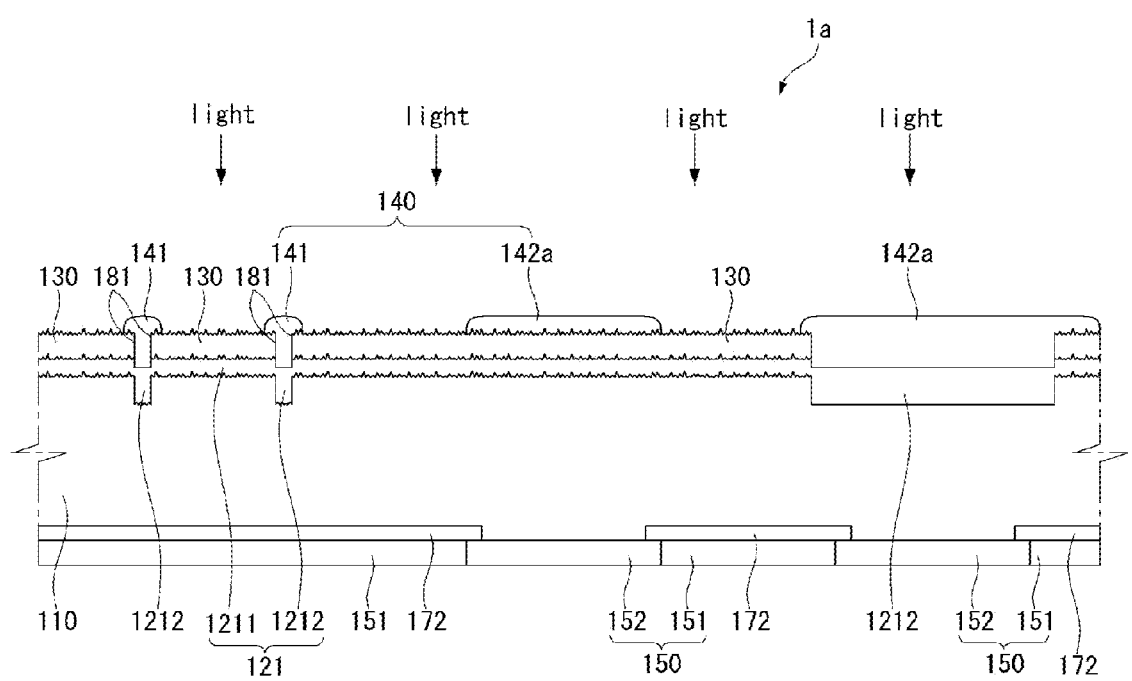
FIG. 22 is a cross-sectional view of the solar cell of FIG. 21 taken along line XXII-XXII.
Figure 23:
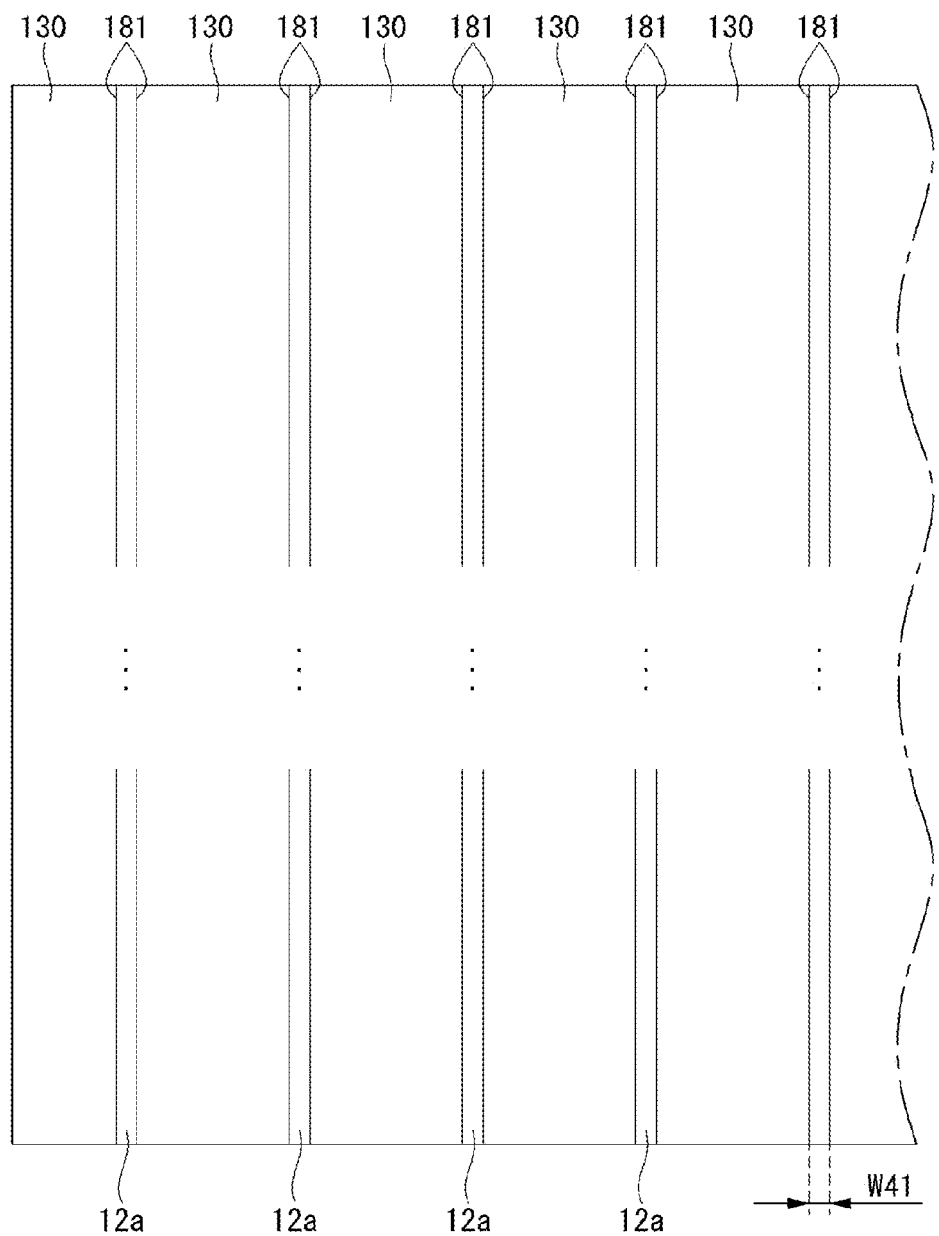
FIG. 23 is a schematic plan view of a plurality of first opening regions formed in an anti-reflection region in the solar cell of FIGS. 21 and 22.

In the solar cell 1a shown in FIGS. 21 to 23, parts having the same structures as those of the solar cells 1 shown in FIGS. 1 and 2 are assigned the same reference numerals, and a detailed description thereof is omitted.

For this, unlike in the solar cells 1 shown in FIGS. 1 and 2, as shown in FIGS. 21 to 23, each of opening regions 181 through which part of the emitter region 121 is exposed is placed only under each of the front electrodes 141, and the plurality of opening regions 182 does not exist under each of the front bus bars 142a.

Accordingly, as shown in FIG. 23, the opening regions 181 are spaced apart from one another and are formed in the same direction. Here, positions where the plurality of opening regions 181 is formed correspond to respective positions where the plurality of front electrodes 141 is formed, and a direction where the plurality of opening regions 181 is extended is identical with a direction where the plurality of front electrodes 141 is extended.

In the solar cell 1a according to the alternative embodiment, a second emitter part 1212 having a higher impurity concentration than a first emitter part 1211 is placed only under each of the front electrodes 141, but is not placed under each of the front bus bars 142a. Thus, only the plurality of front electrodes 141 is connected to the second emitter part 1212, and the plurality of front bus bars 142a is connected to the anti-reflection region 130. Furthermore, since each of the first opening regions 181 where each of the front electrodes 141 is placed is also formed in the part to cross each of the front bus bars 142a, each of the front bus bars 142a is connected to the emitter region 121 (i.e., the second emitter part 1212) in the part to cross each of the front electrodes 141.

In FIG. 23, however, the first opening region 181 may not be placed in the part where the front electrode 141 crosses the front bus bar 142a. In this case, one opening region 181 for one front electrode 141 is not continuous, but is cut in the part where the front bus bar 142 is placed. In this case, each of the front bus bars 142a is not connected to the emitter region 121 both in the part where the front bus bars 142 does not cross each of the front electrodes 141 and in the part where the front bus bars 142 crosses each of the front electrodes 141, but is placed on the anti-reflection region 130 and is directly brought in contact with the anti-reflection region 130.

Each of the front electrodes 141 has the same structure as that shown in FIGS. 1 and 2 because electrode plating is performed on the front electrodes 141 as described above. Accordingly, each of the front electrodes 141 may have a single film made of silver (Ag) or may have a multi-layered film, such as a dual film, including a lower film made of nickel (Ni) and an upper film made of silver (Ag), or a triple film, including a lower film made of nickel (Ni), a middle film made of copper (Cu), and an upper film made of silver (Ag) or tin (Sn).

The front bus bars 142 may be formed by a screen-printing method employing conductive paste containing metal material, such as silver (Ag).

Each of the front electrodes 141 and each of the front bus bars 142 may have the same height or different heights. After the plurality of front electrodes 141 each including at least one film is formed using a plating method, the plurality of front bus bars 142 may be formed using a screen-printing method. In an alternative embodiment, after the plurality of front bus bars 142 is formed, the plurality of front electrodes 141 may be formed.

When the first opening region 181 is also formed in the part where each of the front electrodes 141 crosses each of the front bus bars 142a as shown in FIG. 23, only the front electrode 141 may exit. In an alternative embodiment, however, when the first opening region 181 is also formed in the part where each of the front electrodes 141 crosses each of the front bus bars 142a, a film for the front electrode 141 formed by plating and a film for the front bus bar 142a formed by a screen-printing method may exist at the same time. Here, the order of the film formed by the plating and the film formed by the screen-printing method may be changed according to the order in which the front electrode 141 and the front bus bar 142 are formed.

In this case, the surface of each of the front bus bars 142 has a concave-convex surface because the height of a part of the front bus bar 142a where the front bus bar 142a crosses the front electrode 141 is higher than the height of a part of where the front bus bar 142a does not cross the front electrode 141. Furthermore, a contact area where the front bus bar 142a comes in contact with an interconnector is increased because the surface area of the front bus bar 142a is increased. In addition, since specific contact resistivity is reduced in a part where the front bus bar 142a is connected to the front electrode 141, electric charges are more easily moved from the front electrode 141 to the front bus bar 142a.

While the invention has been shown and described with respect to the preferred embodiments, it will be understood by those skilled in the art that various changes and modifications may be made without departing from the spirit and scope of invention as defined in the following claims.

What is claimed is:

1. A solar cell module, comprising:
   a plurality of solar cells each comprising a substrate having a first conductive type, an emitter region having a second conductive type which is opposite to the first conductive type and on the substrate, an anti-reflection region on the emitter region, a plurality of first electrodes in a first direction and electrically connected to the emitter region through a plurality of first opening regions in the anti-reflection region, a first bus bar crossing the plurality of first electrodes in a second direction and electrically connected to the emitter region through a plurality of second opening regions in the anti-reflection region, a plurality of second electrodes electrically connected to the substrate, and a second bus bar electrically connected to the plurality of second electrodes;

a conductive metal interconnector to electrically connect the first bus bar and the second bus bar of an adjacent solar cell of the plurality of solar cells; and a conductive adhesion film between the first bus bar and the second bus bar and the interconnector, and contains a plurality of conductive particles dispersed in resin to electrically connect the first bus bar and the second bus bar and the interconnector, wherein the anti-reflection region comprises the plurality of first opening regions through which parts of the emitter region are exposed, the plurality of second opening regions through which parts of the emitter region are exposed, and a plurality of grooves which are spaced apart from the second opening regions and expose a portion of the insulator or the emitter region, wherein the plurality of first electrodes are formed through the first opening regions by metal plating, and wherein the first bus bar is in the plurality of grooves.

2. The solar cell module as claimed in claim 1, wherein a resistance value of the exposed emitter region of the first opening region is greater than a resistance value of another emitter region.

3. The solar cell module as claimed in claim 1, wherein one of the plurality of conductive particles has a thickness greater than or equal to a thickness of the conductive adhesion film.

4. The solar cell module as claimed in claim 1, wherein one of the plurality of conductive particles is embedded in one of the interconnector and the first electrodes or the second electrodes.

5. The solar cell module as claimed in claim 1, wherein one of the plurality of conductive particles has a thickness smaller than a thickness of the conductive adhesion film.

6. The solar cell module as claimed in claim 5, wherein two or more of the plurality of conductive particles have a direct contact with each other to have direct contact with one of the interconnector and the first electrodes or the second electrodes.

7. The solar cell modules as claimed in claim 5, wherein two or more of the plurality of conductive particles have an indirect contact with each other to have indirect contact with one of the interconnector and the first electrodes or the second electrodes.

8. The solar cell module as claimed in claim 1, wherein the conductive particles are formed of a metal-coated resin particle including one selected from the group consisting of copper (Cu), silver (Ag), gold (Au), iron (Fe), nickel (Ni), lead (Pb), zinc (Zn), cobalt (Co), titanium (Ti), and magnesium (Mg), as ingredients.

9. The solar cell module as claimed in claim 1, wherein the conductive particles are formed of a metal particle made including one selected from the group consisting of copper (Cu), silver (Ag), gold (Au), iron (Fe), nickel (Ni), lead (Pb), zinc (Zn), cobalt (Co), titanium (Ti), and magnesium (Mg).

10. The solar cell module as claimed in claim 1, wherein one of the plurality of conductive particles has a circle, an oval, or a radial shape.

11. The solar cell module as claimed in claim 1, wherein one of the conductive particles has irregular or protruded portions.

12. The solar cell module as claimed in claim 1, wherein the conductive metal comprises a lead component of 1,000 ppm or less.

13. The solar cell module as claimed in claim 1, wherein the interconnector further comprises solder coated on a surface of the conductive metal.

14. The solar cell module as claimed in claim 1, wherein one of the first electrodes and the second electrodes comprises an uneven surface.

15. The solar cell module as claimed in claim 1, wherein nickel silicide is included between the substrate and one of the first electrodes and the second electrodes.

16. The solar cell module as claimed in claim 1, wherein one of the first electrodes and the second electrodes is formed by the metal plating such that at least one curved surface shape is formed.

17. The solar cell module as claimed in claim 1, wherein one of the first electrodes and the second electrodes comprises:
a first film on the substrate including nickel (Ni), and
a second film on the first film including silver (Ag) or copper (Cu).

18. The solar cell module as claimed in claim 17, further comprising a third film on the second film including silver (Ag) or tin (Sn) when the second film is made of copper (Cu).

19. The solar cell module as claimed in claim 1, wherein a first surface of one of the first electrodes and the second electrodes in contact with the conductive adhesion film has a convex curved surface.

20. The solar cell module as claimed in claim 1, wherein a height at a center of the conductive adhesion film is less than a height at an edge of the conductive adhesion film.

21. The solar cell module as claimed in claim 1, wherein depths of the plurality of grooves are less than depths of the first and the second opening regions.

22. The solar cell module as claimed in claim 1, wherein the insulating layer anti-reflection region is between the plurality of grooves and the first and the second opening regions, and a portion of the first bus bar directly contacting the insulating layer anti-reflection region does not contact the emitter region.

23. The solar cell module as claimed in claim 1, wherein the first electrodes and the first bus bar comprise a plurality of layers.

* * * * *